(12) United States Patent
Hisamoto et al.

(10) Patent No.: US 7,259,422 B1
(45) Date of Patent: Aug. 21, 2007

(54) NONVOLATILE SEMICONDUCTOR MEMORY DEVICE AND ITS FABRICATION METHOD

(75) Inventors: Digh Hisamoto, Kokubunji (JP); Kan Yasui, Kodaira (JP); Shinichiro Kimura, Kunitachi (JP); Daisuke Okada, Kunitachi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/653,832

(22) Filed: Jan. 17, 2007

(30) Foreign Application Priority Data

Mar. 13, 2006 (JP) .............................. 2006-067088

(51) Int. Cl.
*H01L 29/788* (2006.01)
(52) U.S. Cl. ................ 257/316; 438/266; 257/E21.179
(58) Field of Classification Search ........ 438/257–267; 257/316–321
See application file for complete search history.

(56) References Cited

U.S. PATENT DOCUMENTS

| | | | |
|---|---|---|---|
| 5,108,939 A * | 4/1992 | Manley et al. | 438/594 |
| 5,284,784 A * | 2/1994 | Manley | 438/263 |
| 5,969,383 A | 10/1999 | Chang et al. | 257/316 |
| 6,194,272 B1* | 2/2001 | Sung | 438/266 |
| 6,477,084 B1 | 11/2002 | Eitan | 365/185.18 |
| 2004/0119107 A1 | 6/2004 | Hisamoto et al. | 257/314 |
| 2005/0029567 A1 | 2/2005 | Mori | 257/298 |

FOREIGN PATENT DOCUMENTS

| | | |
|---|---|---|
| JP | 2002-352040 | 12/2002 |
| JP | 2005-26300 | 1/2005 |

OTHER PUBLICATIONS

S. Sze, "Physics of Semiconductor Devices," 2nd edition, Wiley-Interscience Publication, p. 496-506.
W. Chen et al., "A Novel Flash Memory Device with SPlit Gate Source Side Injection and ONO Charge Storage Stack (SPIN)," 1997 Symposium on VLSI Technology Digest of Technical Papers, pp. 63-64.
A. T. Wu et al., "A Novel High-Speed, 5-Volt Programming EPROM Structure with Source-Side Injection," IEEE International Electron Devices Meeting, 1986, pp. 584-587.
T. Chan, "The Impact of Gate-Induced Drain Leakage Current on MOSFET Scaling," IEEE International Electron Devices Meeting, 1987, pp. 718-721.

* cited by examiner

*Primary Examiner*—Richard A. Booth
(74) *Attorney, Agent, or Firm*—Miles & Stockbridge P.C.

(57) ABSTRACT

A memory cell includes a selective gate and a memory gate arranged on one side surface of the selective gate. The memory gate includes one part formed on one side surface of the selective gate and the other part electrically isolated from the selective gate and a p-well through an ONO layer formed below the memory gate. A sidewall-shaped silicon oxide is formed on side surfaces of the selective gate, and a sidewall-shaped silicon dioxide layer and a silicon dioxide layer are formed on side surfaces of the memory gate. The ONO layer formed below the memory gate is terminated below the silicon oxide, and prevents generation of a low breakdown voltage region in the silicon oxide near an end of the memory gate during deposition of the silicon dioxide layer.

3 Claims, 27 Drawing Sheets

NONVOLATILE SEMICONDUCTOR MEMORY DEVICE AND ITS FABRICATION METHOD

CROSS-REFERENCE TO RELATED APPLICATION

The present application claims priority from Japanese patent application No. JP 2006-67088 filed on Mar. 13, 2006, the content of which is hereby incorporated by reference into this application.

TECHNICAL FIELD OF THE INVENTION

The present invention relates to a semiconductor memory device and a fabrication technique for the semiconductor memory device, and particularly relates to a technique effective to be applied to a nonvolatile semiconductor memory device including memory cells each including a charge trapped layer constituted by a silicon nitride layer.

BACKGROUND OF THE INVENTION

An electrically erasable and programmable nonvolatile read only memory is quite an important element in various LSI applied fields since stored information remains in each memory cell even if the memory is turned off.

There is described a so-called floating-gate nonvolatile memory and a nonvolatile memory using an insulating layer in S. Sze, "Physics of Semiconductor Devices, 2nd edition", A Wiley-Interscience Publication (Non-Patent Document 1), pages 496-506. As disclosed in the Non-Patent Document 1, it is known that there is no need to separately form a conductive layer for accumulating charges in a nonvolatile memory in which charges are accumulated in a trap of an insulating layer or in an interface of a multilayer insulating layer, differently from a floating-gate nonvolatile memory in which charges are accumulated in a polycrystalline silicon layer. It is, therefore, possible to form memory cells with high consistency with CMOS-LSI process.

However, the nonvolatile semiconductor memory configured so that charges are accumulated in the insulating layer is required to include the insulating layer capable of maintaining sufficient charge holding characteristics even if injection and emission of charges are repeated. It is, therefore, difficult to realize such a nonvolatile semiconductor memory. There has been proposed, by contrast, a nonvolatile semiconductor memory that rewrites stored information by injecting charges having different signs in place of emitting charges. Operation performed by this nonvolatile semiconductor memory is described in "Symposium on VLSI Technology in 1997" (Non-Patent Document 2), pages 63-64. The nonvolatile semiconductor memory is characterized in that a polycrystalline silicon gate for causing each memory cell to operate and a gate for selecting one of the memory cells are formed separately. The same characteristic is also disclosed in U.S. Pat. No. 5,969,383 (Patent Document 1) and U.S. Pat. No. 6,477,084 (Patent Document 2).

A memory cell of the nonvolatile semiconductor memory disclosed in the Non-Patent Document 2 or the like is basically constituted by two transistors (a selective transistor and a memory transistor) each based on an n-channel MOSFET. The memory transistor is arranged next to the selective transistor to be connected to the selective transistor in a so-called 'stacked in series' manner. FIG. 35 is an equivalent circuit to the memory cell. FIG. 36 is a schematic of an example of a memory array constituted by such memory cells. Gates (a selective gate and a memory gate) of the selective transistor and the memory transistor constitute word lines SGL and MGL, and diffused layers thereof constitute a bit line BL and a source line SL, respectively.

In the memory cell shown in FIG. 35, a gate insulating layer of the memory gate is configured to have a so-called MONOS (metal-oxide-nitride-oxide-semiconductor) structure in which a silicon nitride layer serving as a charge trapped layer is held between two silicon dioxide layers. A gate insulating layer of the selective gate is constituted by a silicon dioxide layer. The selective gate-side diffused layer is formed by implantation of impurity ions with the selective gate used as a mask, and the memory gate-side diffused layer is formed by implantation of impurity ions with the memory gate used as a mask. Biases applied to these nodes are Vmg, Vcg, Vs, Vd, and Vbb, respectively (see FIG. 35).

Basic operations performed by the memory cell are four operations, i.e., (1) write, (2) erasing, (3) holding, and (4) read operations. It is to be noted that these four operations are denoted by typical notations and that the write and erasing operations are sometimes denoted differently. Furthermore, typical operations will be described; however, various other operations can be considered. Although the memory cell constituted by the n-channel MOSFETs will be described herein, a memory cell constituted by p-channel MOSFETs are identical to the former memory cell in principle.

FIG. 37 is a schematic for typically explaining the write operation performed by the memory cell, and FIG. 38 is a schematic for typically explaining the erasing operation performed by the memory cell. In FIGS. 37 and 38, reference symbol 50 denotes a semiconductor substrate (hereinafter, simply "substrate") made of monocrystalline silicon, 51 denotes a selective gate, 52 denotes a memory gate, 53 denotes a gate insulating layer, 54 denotes an ONO layer, 55 denotes a selective gate-side diffused layer, and 56 denotes a memory gate-side diffused layer.

(1) In a write operation, a positive potential is applied to the diffused layer 56 on the memory gate 52 side, and the same ground potential as that applied to the substrate 50 is applied to the diffused layer 55 on the selective gate 51 side. By applying a gate overdrive voltage higher than that applied to the substrate 50 to the memory gate 52, a channel under the memory gate 52 is turned into an ON-state. By setting a potential of the selective gate 51 to a value higher than a threshold voltage by 0.1V to 0.2V, a channel under the selective gate 51 is turned into an ON-state. At this time, a highest electric field is generated near a boundary between the two gates 51 and 52, so that many hot electrons are generated and injected into the memory gate 52. A state of generating carriers by electric field acceleration and impact ionization is denoted by symbol A. An electron is denoted by a white circle and a hole is denoted by a hatched circle.

This phenomenon is known and referred to as "source side injection or SSI", which is described in A. T. Wu et al., "IEEE International Electron Device Meeting", Technical Digest, pages 584-587, 1986 (Non-Patent Document 3). In the Non-Patent Document 3, a floating-gate memory cell has been described. However, a memory cell in which an insulating layer is used as charge trapped layer is identical to the floating-gate memory cell in injection mechanism.

The hot electron injection by the above-stated method is characterized in that the hot electron injection concentrates on a selective gate 51-side end of the memory gate 52 because of concentration of the electric field near the boundary between the selective gate 51 and the memory gate 52. Furthermore, while in the floating gate-type memory cell, the charge trapped layer is constituted by a conductive layer, in an insulating layer-type memory cell, charges are accumulated in the insulating layer (ONO layer 54). Therefore, electrons are held in an extremely narrow region in the insulating layer-type memory cell.

(2) In an erasing operation, a negative potential is applied to the memory gate 52 and the positive potential is applied to the diffused layer 56 on the memory gate 52 side so as to cause strong inversion on an end of the diffused layer 56 on which the memory gate 52 overlaps with the diffused layer 56. An interband tunnel phenomenon is thereby generated and holes are generated (denoted by symbol B). The interband tunnel effect is disclosed in, for example, T. Y. Chan et al., "IEEE International Electron Device Meeting", Technical Digest, pages 718-721, 1987 (Non-Patent Document 4).

In this memory cell, the generated holes are accelerated in channel direction, attracted by a bias applied to the memory gate 52, and injected into the ONO layer 54, whereby the erasing operation is performed. A state of generating a secondary electron-hole pair resulting from the generated hole is denoted by symbol C. The carries are also injected into the ONO layer 54. Namely, a threshold voltage of the memory gate 52 that has risen by electron charges can be reduced by charges of the injected holes.

(3) In a holding operation, the charges are held as the charges of the carriers injected into the ONO layer 54. Since movement of the carriers in the ONO layer 54 is quite small and slow, the charges can be satisfactorily held even if a voltage is not applied to the memory gate 52.

(4) In a read operation, by applying a positive potential to the selective gate 51-side diffused layer 55 and the selective gate 51, the channel below the selective gate 51 is turned into the ON-state. The held charge information is read as a current by applying potential appropriate for discriminating a threshold voltage difference in the memory gate 52 between the write and erasing states (that is, an intermediate potential between the threshold voltage in a write state and that in an erasing state).

To fabricate the memory cell shown in FIGS. 35 to 38, it is effective to form the selective gate, and then form the sidewall-shaped memory gate on a side surface of the selective gate using spacer process as disclosed in the Non-Patent Document 2. FIG. 39 is a schematic of a plane structure of a memory cell array formed by the process. FIG. 40 is a cross-sectional view taken along a line A-A of FIG. 39. If memory cells are arranged in an array, the memory array structure shown in FIG. 36 is formed. Since the spacer process is self-alignment process, there is basically no need to newly pattern the memory gate. An area of each memory cell can be, therefore, reduced. The spacer process is effective for high integration and reduction in chip area. Furthermore, a gate length of the memory gate can be made smaller than a minimum feature size, so that high current driving force can be advantageously obtained.

According to studies of the inventors of the present invention, however, the conventional method of forming the memory gate on one side surface of the selective gate using the spacer process has the following disadvantages. The conventional disadvantages will be described with reference to FIGS. 41 to 45. In each of FIGS. 41 to 45, a left part shows a cross section taken along the line A-A of FIG. 39 and a right part shows a cross section in a direction orthogonal to the line A-A.

First, as shown in FIG. 41, after the gate insulating layer 53 is formed by thermally oxidizing the substrate 50, the selective gate 51 is formed on the gate insulating layer 53 and the ONO layer 54 is formed on the substrate 50. The selective gate 51 is formed by patterning a polycrystalline silicon layer deposited on the substrate 50 by CVD (chemical vapor deposition). The ONO layer 54 is a multilayer film in which a silicon nitride layer is formed between two silicon dioxide layers, and is formed by thermal oxidation and the CVD. In FIGS. 41 to 45, reference symbol 57 denotes a device isolation trench.

As shown in FIG. 42, after a polycrystalline silicon layer is deposited on the ONO layer 54 by the CVD, the polycrystalline silicon layer is anisotropically etched, thereby forming the sidewall-shaped memory gate 52 on each of both side surfaces of the selective gate 51.

Next, as shown in FIG. 43, one of the memory gates 52 formed on the respective side surfaces of the selective gates 51 is covered with a photoresist layer 57 and the other memory gate 52 is etched and removed, thereby leaving the memory gate 52 on one surface of the selective gate 51.

After removing the photoresist layer 57, the unnecessary ONO layer 54 left on an upper surface, one side surface and the like of the selective gate 51 is etched and removed as shown in FIG. 44. At this time, it is difficult to remove the ONO layer 54 on the side surface of the selective gate 51 by dry etching. It is, therefore, necessary to remove the ONO layer 54 by wet etching with which the ONO layer 54 can be isotropically etched. If the wet etching is performed, then the ONO layer 54 is side-etched below the memory gate 52 and an end of the ONO layer 54 is retreated in a direction of the selective gate 51. A recess 59 is thereby generated below an end of the memory gate 52.

As a result, as shown in FIG. 45, when a silicon dioxide layer 60 is deposited on the substrate 50 at a later step, the silicon dioxide layer 60 cannot completely cover up an interior of the recess 59, and a cavity 61 is, therefore, formed in the silicon dioxide layer 60 near the recess 59. Furthermore, even if the cavity 61 is not formed, a density of the silicon dioxide layer 60 near the recess 59 is reduced. As a result, the silicon dioxide layer 60 near the recess 59, that is, near the end of the memory gate 52 is low in breakdown voltage.

As already stated, in the write operation performed by this memory cell, the high voltage (Vmg) is applied to the memory gate 52 and a low source voltage (Vs) is applied to the diffused layer 56, so that a strong longitudinal electric field is generated near the end of the memory gate 52. Due to this, if a low breakdown voltage region is present in the silicon dioxide layer 60 in an area of the strong longitudinal electric field, a short-circuit occurs between the memory gate 52 and the substrate 50 (diffused layer 56).

To eliminate the recess 59, there is proposed wet-etching the ONO layer 54, thermally oxidizing the substrate 50, and thereby making the ONO layer 54 below the memory gate 52 thicker. However, since a thickness of the ONO layer 54 of a nonvolatile memory in the generation of 0.13 μm to 0.18 μm is equal to or larger than 20 nanometers, it is difficult to eliminate the recess 59 by thermal oxidation.

SUMMARY OF THE INVENTION

It is an object of the present invention to provide a technique capable of improving the reliability of a nonvolatile semiconductor memory device including a memory cell that includes a charge trapped layer constituted by a silicon nitride layer.

The above and other objects and novel features of the present invention will be readily apparent from the description of the specification and the accompanying drawings.

An outline of typical elements of the invention disclosed in this application is described briefly as follows.

According to an aspect of the present invention, there is provided a method of fabricating a semiconductor device comprising steps of:

(a) forming a first conductive layer on a principal surface of a semiconductor substrate through a gate insulting layer, and then forming a selective gate by patterning the first conductive layer;

(b) forming an ONO layer on the semiconductor substrate including an upper surface and both side surfaces of the selective gate;

(c) forming a second conductive layer on the ONO layer, and then forming a memory gate electrically isolated from the selective gate and the semiconductor substrate through the ONO layer on each of the both side surfaces of the selective gate by anisotropically etching the second conductive layer, the memory gate being in a form of a sidewall;

(d) forming a first insulating layer on the semiconductor substrate, and then forming the first insulating layer in the form of the sidewall on an other side surface of the memory gate formed on each of the both side surfaces of the selective gate by anisotropically etching the first insulating layer;

(e) leaving the memory gate and the first insulating layer on one of the side surfaces of the selective gate and removing the memory gate and the first insulating layer formed on the other side surface of the selective gate by etching using a photoresist layer as a mask, (f) after the step (e), leaving the ONO layer having an L-shaped cross section between one of the side surfaces of the selective gate and one side surface of the memory gate and below the memory gate by wet-etching the ONO layer; and (g) after the step (f), forming a second insulating layer on the semiconductor substrate, and forming the second insulating layer in the form of the sidewall on an other side surface of the memory gate, and the second insulating layer in the form of the sidewall on the other side surface of the selective gate by anisotropically etching the second insulating layer.

According to the one aspect of the present invention, it is advantageously possible to improve the reliability of the semiconductor device.

DESCRIPTION OF THE PREFERRED EMBODIMENTS

Embodiments of the present invention will be described hereinafter in detail with reference to the drawings. The same constituent elements are basically denoted by the same reference symbols, respectively in all of the drawings for explaining the embodiments, and they will not be repeatedly described in the specification.

First Embodiment

Figure 1:
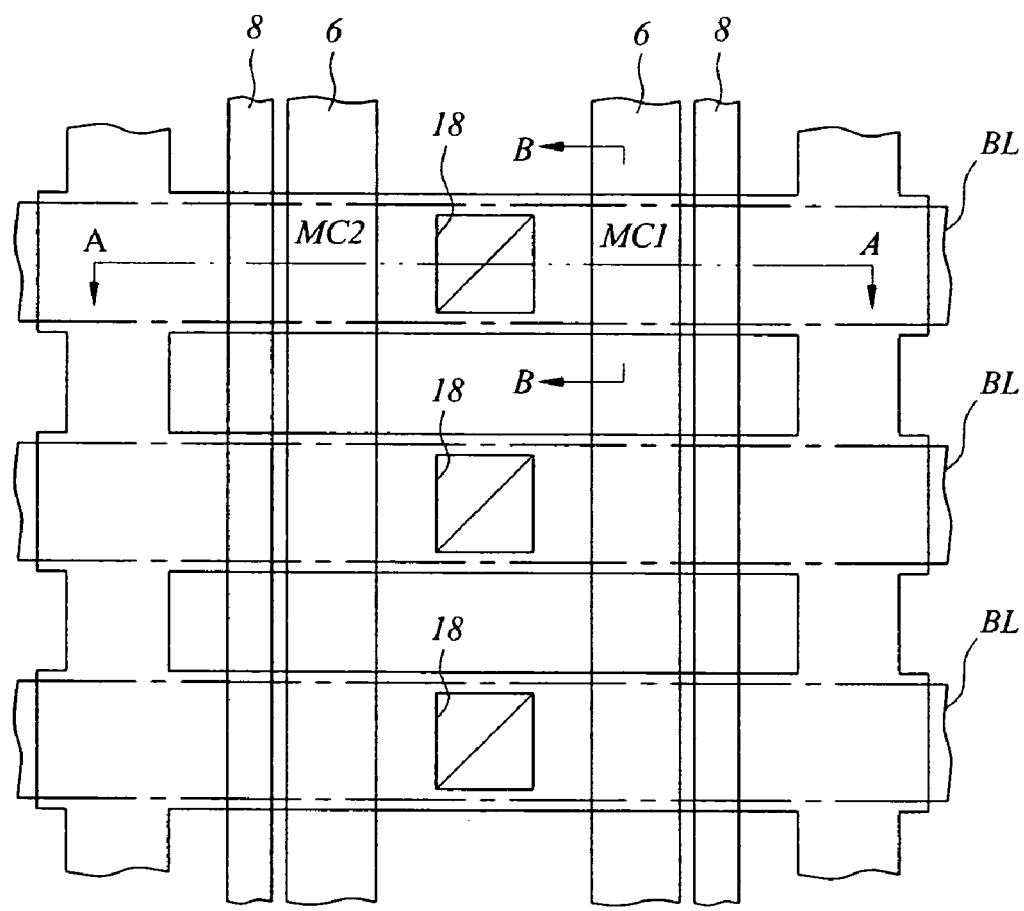
FIG. 1 is a plan view of principal parts of a MONOS nonvolatile memory according to one embodiment of the present invention.
Figure 2:
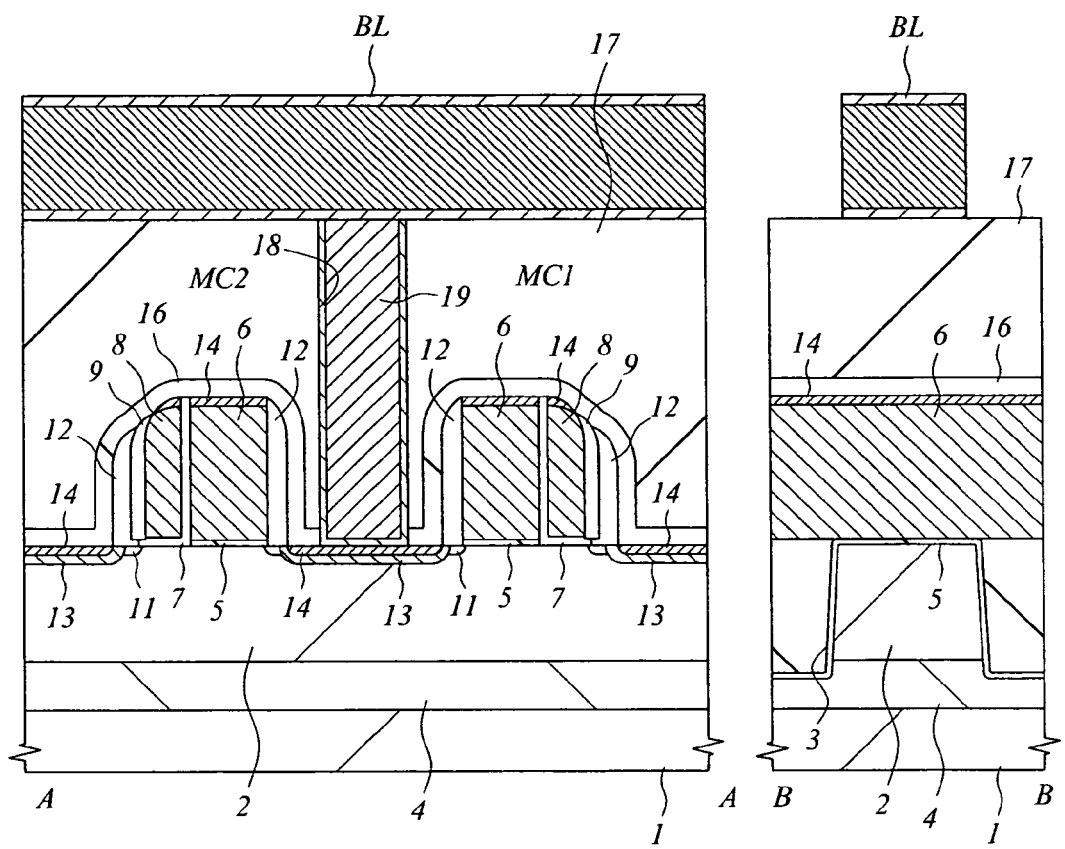
FIG. 2 is a cross-sectional view of principal parts of the MONOS nonvolatile memory according to one embodiment of the present invention.

FIG. 1 is a plan view of principal parts showing a MONOS nonvolatile memory according to a first embodiment of the present invention. In FIG. 2, a left part is a cross-sectional view taken along a line A-A of FIG. 1 and a right part is a cross-sectional view taken along a line B-B of FIG. 1. In FIG. 1, two adjacent memory cells $MC_1$ and $MC_2$ in an extension direction of bit lines BL are shown.

The memory cells $MC_1$ and $MC_2$ of the MONOS nonvolatile memory are formed in a p-type well 2 on a semiconductor substrate (hereinafter, simply "substrate") 1 made of p-type monocrystalline silicon. The p-type well 2 is electrically isolated from the substrate 1 through a well-isolation n-type buried layer 4, and a desired voltage is applied to the p-type well 2.

Each of the memory cells $MC_1$ and $MC_2$ is configured to have a split gate structure including a selective gate 5 and a memory gate 6. The selective gate 6 is made of an n-type polycrystalline silicon layer and formed on a gate dioxide layer 5 made of a silicon dioxide layer. The memory gate 8 is made of an n-type polycrystalline silicon layer and arranged on one side surface of the selective gate 6. The memory gate 8 includes one part formed on one side surface of the selective gate 6 and the other part electrically isolated from the selective gate 6 and the p-type well 2 through an ONO layer 7 formed below the memory gate 8 and having an L-shaped cross section. The ONO layer 7 is constituted by two silicon dioxide layers and a silicon nitride layer (charge trapped layer) formed between the silicon dioxide layers. In a data write operation, hot electrons generated in a channel region are injected into the silicon nitride layer that forms part of the ONO layer 7 and captured in a trap of the silicon nitride layer.

An $n^+$-semiconductor region 13 is formed in each of the p-type well 2 near the selective gate 6 and that near the memory gate 8. The $n^+$-semiconductor region 13 functions as a source or a drain of a transistor that constitutes each of the memory cells $MC_1$ and $MC_2$. Furthermore, an $n^-$-type semiconductor region 11 lower in impurity concentration than the $n^+$-type semiconductor region 13 is formed in the p-type well 2 in a region adjacent to the $n^+$-type semiconductor region 13. The $n^-$-type semiconductor region 11 functions as an extension region for relaxing a high electric field on an end of the source and/or drain ($n^+$-type semiconductor region 13).

A sidewall-shaped silicon dioxide layer 12 is formed on an opposite side surface of the selective gate 6 to that on which the ONO film 7 is formed. Sidewall-shaped silicon dioxide layers 9 and 12 are formed on an opposite side surface of the memory gate 8 to that on which the ONO film 7 is formed. A part formed on the p-type well 2 of the ONO film 7 having the L-shaped cross section is terminated below the silicon dioxide layer 9.

A Co (cobalt) silicide layer 14 is formed on surfaces of the selective gate 6, the memory gate 8, and the $n^+$-type semiconductor region 13. The Co silicide layer 14 is formed to reduce resistances of the selective gate 6, the memory gate 8, and the $n^+$-type semiconductor region 13, respectively.

A bit line BL is formed above the memory cells $MC_1$ and $MC_2$ configured as stated above through a silicon nitride layer 20 and a silicon dioxide layer 21. The bit line BL is electrically connected to one of the source and the drain (the $n^+$-type semiconductor region 13 shared between the two memory cells $MC_1$ and $MC_2$) through a plug 19 in a contact hole 18 formed in the silicon nitride layer 20 and the silicon dioxide layer 21. The bit line BL is made of a metal film mainly consisting of Al (aluminum alloy), and the plug 19 is made of a metal film mainly consisting of W (tungsten).

Since a memory array using the memory cells $MC_1$ and $MC_2$ are identical in configuration to the memory array shown in FIG. 2, it will not be repeatedly described. Moreover, since operations performed by the memory cells $MC_1$ and MC₂ are similar to those described with reference to FIGS. 4 and 5, they will not be repeatedly described.

Referring next to FIGS. 3 to 15, a method of fabricating the MONOS nonvolatile memory will be described in order of steps. In the first embodiment, the fabrication method using process technique corresponding to so-called 0.13-µm generation will be described.

Figure 3:
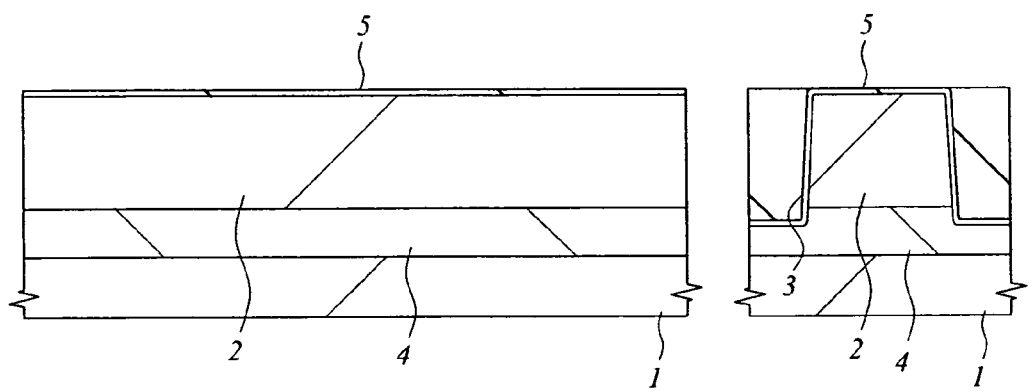
FIG. 3 is a cross-sectional view of principal parts showing a method of fabricating the MONOS nonvolatile memory according to one embodiment of the present invention.

First, as shown in FIG. 3, after a device isolation trench 3 is formed on a principal surface of the substrate 1 using a well-known fabrication technique, the p-type well 2 and an n-type buried layer 4 are formed on the principal surface of the substrate 1. By thermally oxidizing the substrate 1, a gate oxide layer 5 having a thickness of about 2.5 nanometers is formed on a surface of the p-type well 2. To form the device isolation trench 3, a silicon nitride layer is deposited on the substrate 1 by the CVD, and the substrate 1 is etched using the silicon nitride layer as a mask, thereby forming the device isolation trench 3 having a depth of about 300 nanometers. Next, a silicon dioxide layer is deposited on the substrate 1 by the CVD, and the silicon dioxide layer is buried in the device isolation trench 3. The silicon dioxide layer outside of the device isolation trench 3 is removed by chemical mechanical polishing (CMP). It is to be noted that the n-type buried layer 4 is a diffused layer for isolating the memory array from peripheral circuits. The peripheral circuits of the MONOS nonvolatile memory include, for example, a sense amplifier, a column decoder, a row decoder, and a boosting circuit. Each of these peripheral circuits, which is constituted by an n-channel MOSFET and a p-channel MOSFET, will not be described herein.

Figure 4:
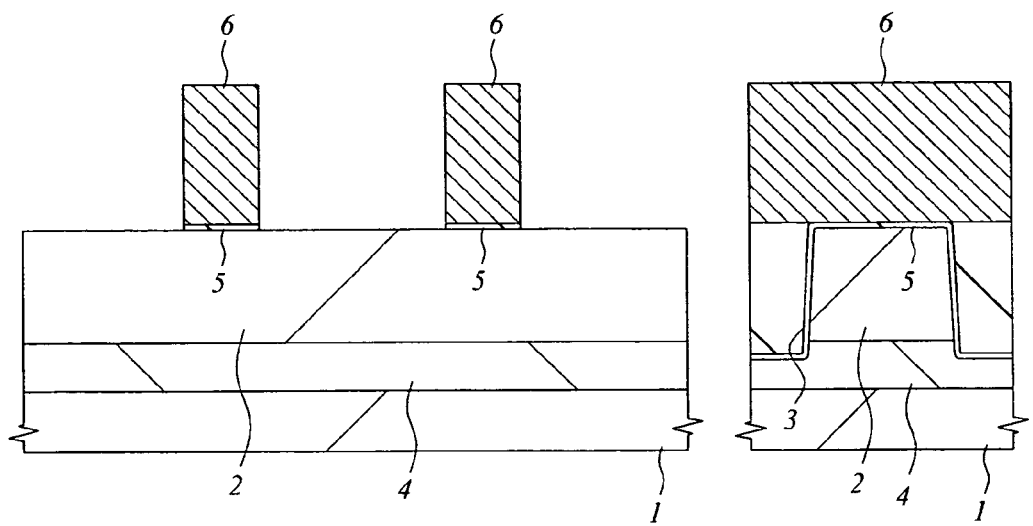
FIG. 4 is a cross-sectional view of principal parts showing the method of fabricating the MONOS nonvolatile memory subsequent to FIG. 3.

As shown in FIG. 4, the selective gate 6 is formed on the gate dioxide layer 5. To form the selective gate 6, an n-type polycrystalline silicon layer having a thickness of about 200 nanometers is deposited on the gate dioxide layer 5 by the CVD and then patterned by dry etching using a photoresist layer as a mask.

Figure 5:
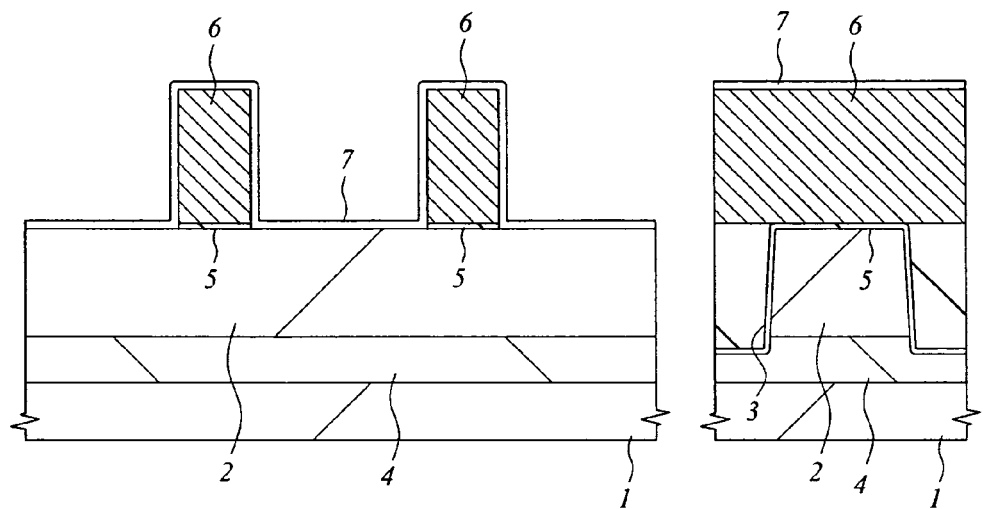
FIG. 5 is a cross-sectional view of principal parts showing the method of fabricating the MONOS nonvolatile memory subsequent to FIG. 4.

As shown in FIG. 5, the ONO layer 7 is formed on the substrate 1. To form the ONO layer 7, a silicon dioxide layer having a thickness of about four nanometers is formed by thermally oxidizing the surface of the substrate 1, a silicon nitride layer having a thickness of about eight nanometers is deposited on the silicon dioxide layer by the CVD, and a silicon dioxide layer having a thickness of about seven nanometers is deposited on the silicon nitride layer by the CVD. Alternatively, the ONO layer 7 can be formed by In-Situ Steam Generation (ISSG) oxidization. The ISSG oxidization is a process in which hydrogen and oxygen are directly introduced into a chamber of an oxidization device and in which a radical oxidation reaction is produced on the heated substrate 1. To form the ONO layer 7 by the ISSG oxidation, the surface of the substrate 1 is subjected to ISSG oxidation to form a silicon dioxide layer having a thickness of about five nanometers, and a silicon nitride layer having a thickness of about 14 nanometers is deposited on the silicon dioxide layer by the CVD. Next, the silicon nitride layer is subjected to the ISSG oxidation to convert a part of the silicon nitride layer into a silicon dioxide layer having a thickness of about six nanometers.

Figure 6:
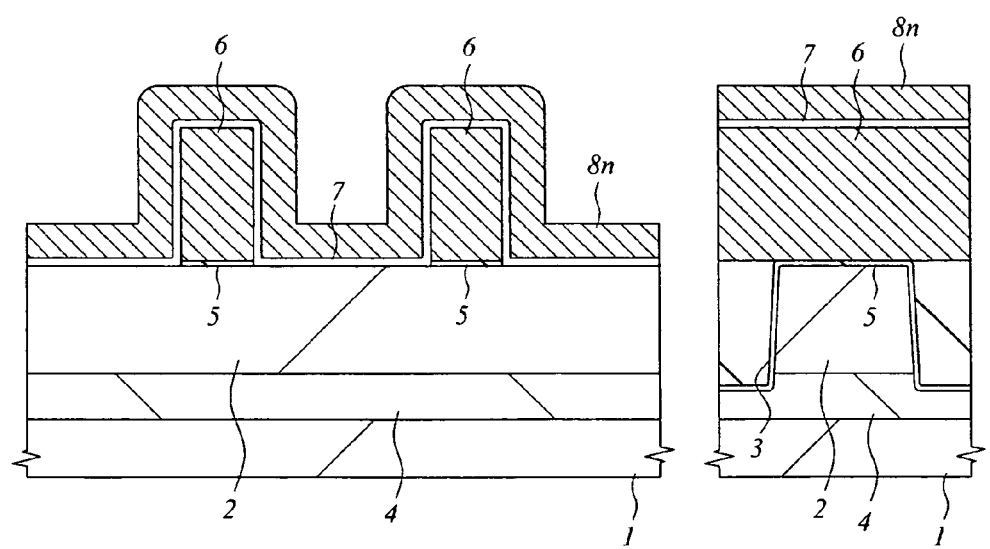
FIG. 6 is a cross-sectional view of principal parts showing the method of fabricating the MONOS nonvolatile memory subsequent to FIG. 5.
Figure 7:
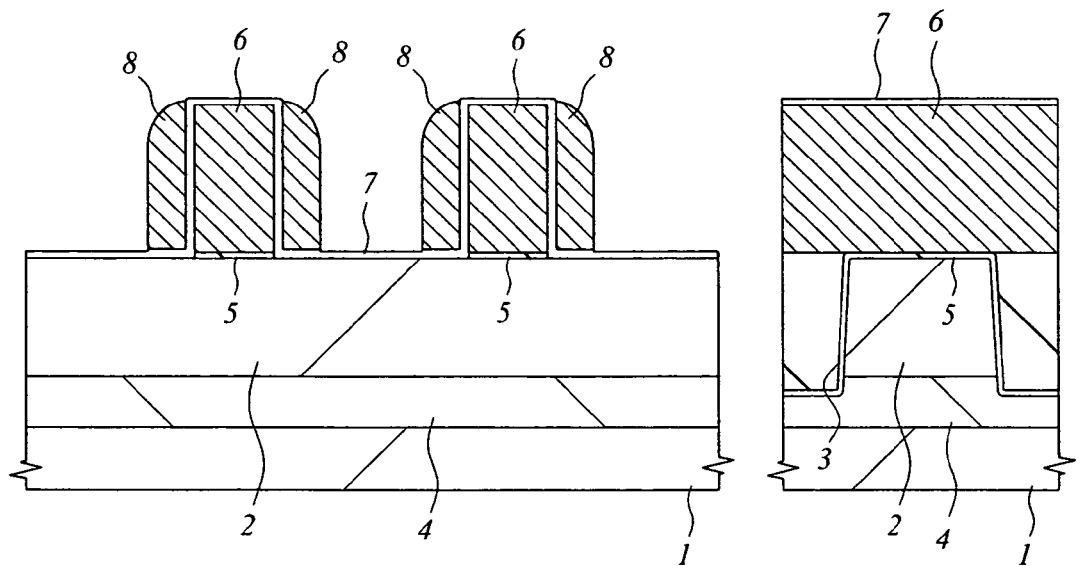
FIG. 7 is a cross-sectional view of principal parts showing the method of fabricating the MONOS nonvolatile memory subsequent to FIG. 6.

As shown in FIG. 6, an n-type polycrystalline silicon layer 8*n* having a thickness of about 70 nanometers is deposited on the ONO film 7 by the CVD. The n-type polycrystalline silicon layer 8*n* is then anisotropically etched, thereby forming the sidewall-shaped memory gates 8 on the respective both side surfaces of the selective gate 6 as shown in FIG. 7.

Figure 8:
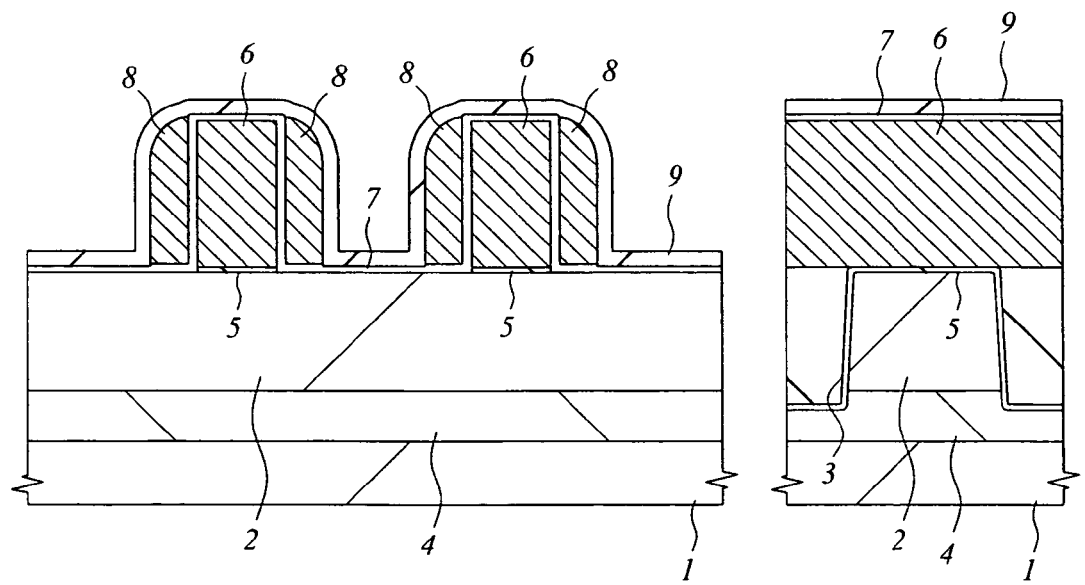
FIG. 8 is a cross-sectional view of principal parts showing the method of fabricating the MONOS nonvolatile memory subsequent to FIG. 7.

As shown in FIG. 8, the silicon dioxide layer 9 having a thickness of about 20 nanometers is deposited on the substrate 1 by the CVD. The silicon dioxide layer 9 is anisotropically etched, thereby leaving sidewall-shaped silicon dioxide layers 9 on respective side surfaces of the selective gate 6.

Figure 10:
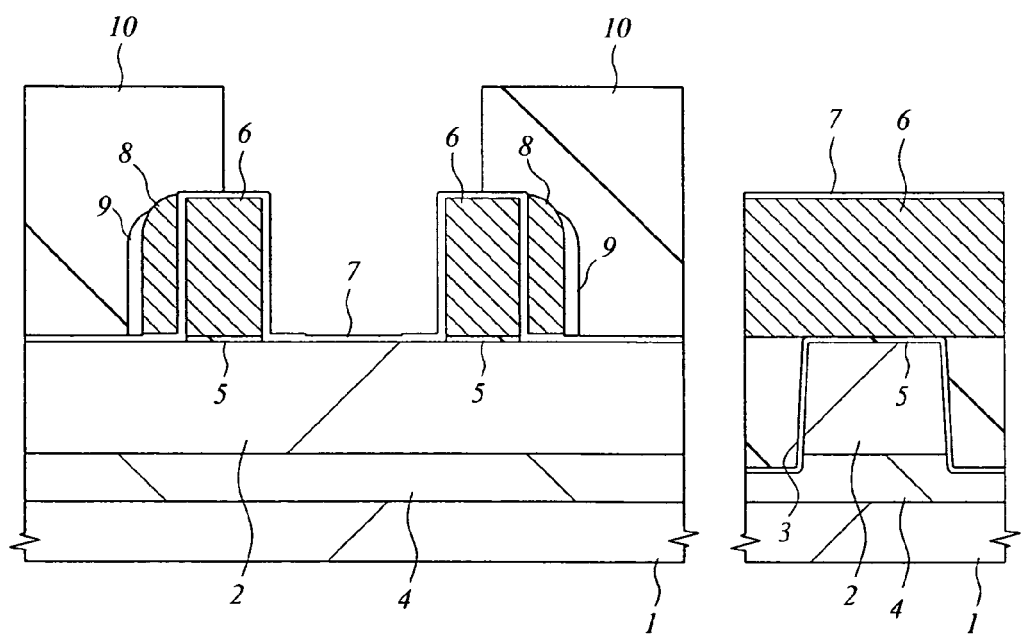
FIG. 10 is a cross-sectional view of principal parts showing the method of fabricating the MONOS nonvolatile memory subsequent to FIG. 9.

As shown in FIG. 10, one of the memory gates 8 formed on the both side surfaces of the selective gate 6 is covered with a photoresist layer 10, and the other memory gate 8 as well as the silicon dioxide layer 9 on the side surface of the other memory gate 8 is etched and removed, thereby leaving the memory gate 8 on one side surface of the selective gate 6.

Figure 11:
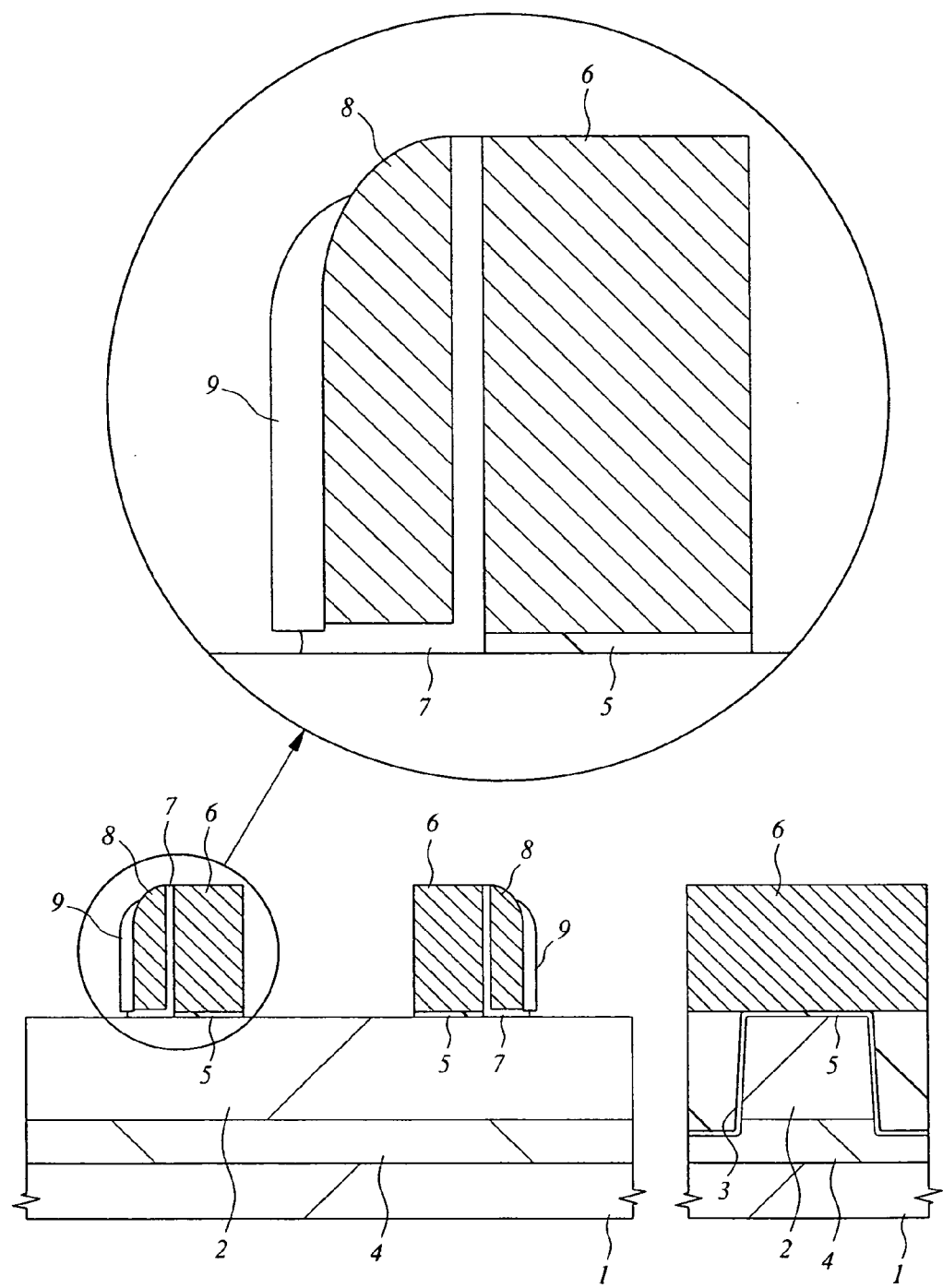
FIG. 11 is a cross-sectional view of principal parts showing the method of fabricating the MONOS nonvolatile memory subsequent to FIG. 10.

After removing the photoresist layer 10, the unnecessary ONO film 7 left on the upper surface, one side surface and the like of the selective gate 6 is etched and removed as shown in FIG. 11. At this time, it is difficult to remove the ONO layer 7 on the side surface of the selective gate 6 by dry etching. The ONO layer 6 thereon is, therefore, removed by wet etching with which the ONO layer 7 can be isotropically etched. The silicon dioxide layers in the ONO layer 7 are etched by hydrofluoric acid, and the silicon nitride layer in the ONO layer 7 is etched by phosphoric acid.

If the wet etching is performed on the ONO layer 7, the ONO layer 7 is retreated (side-etched) in a downward direction of the memory gate 8 below the silicon dioxide layer 9 formed on the side surface of the memory gate 8 as shown in an enlarged view of FIG. 11. By setting a thickness of the silicon dioxide film 9 (thickness horizontal to the principal surface of the substrate 1) to be larger than a retreat amount of the ONO film 7, it is possible to prevent an end of the side-etched ONO layer 7 from reaching the end of the memory gate 8.

Figure 12:
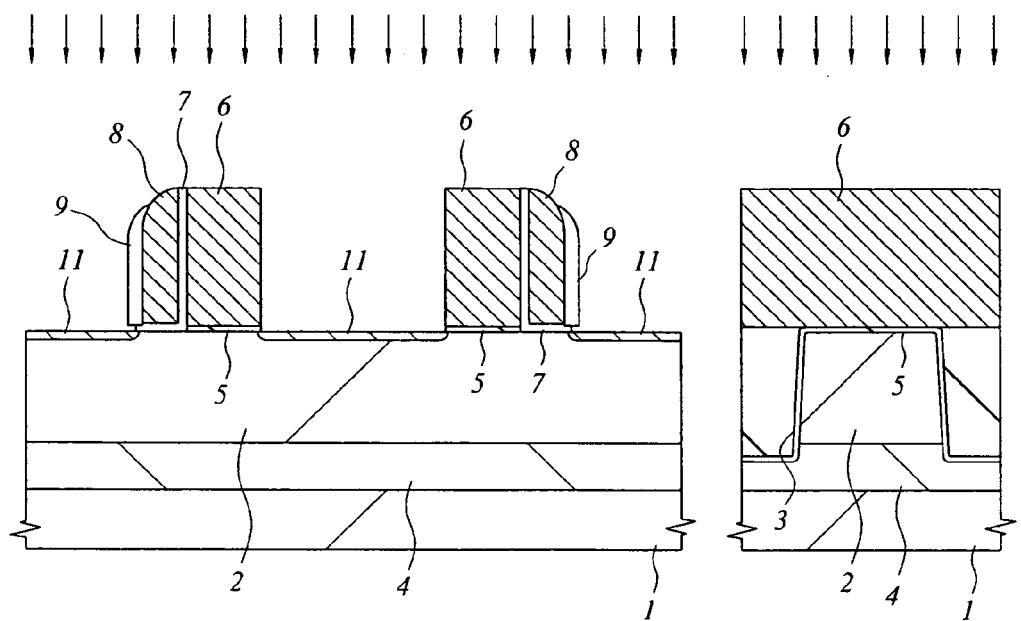
FIG. 12 is a cross-sectional view of principal parts showing the method of fabricating the MONOS nonvolatile memory subsequent to FIG. 11.
Figure 13:
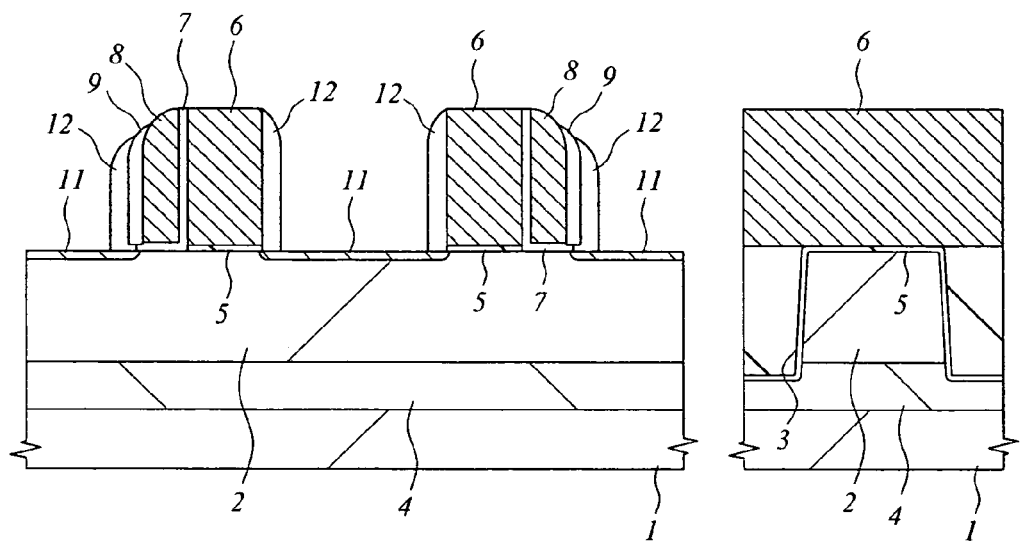
FIG. 13 is a cross-sectional view of principal parts showing the method of fabricating the MONOS nonvolatile memory subsequent to FIG. 12.

As shown in FIG. 12, impurity (phosphorus or arsenic) ions are implanted into the substrate 1, thereby forming the n⁻-type semiconductor region 11. Thereafter, as shown in FIG. 13, the silicon dioxide layer 12 is deposited on the substrate 1 by the CVD and anisotropically etched, thereby forming the sidewall-shaped silicon dioxide layer 12 on one side surface of each of the selective gate 6 and the memory gate 8.

Figure 14:
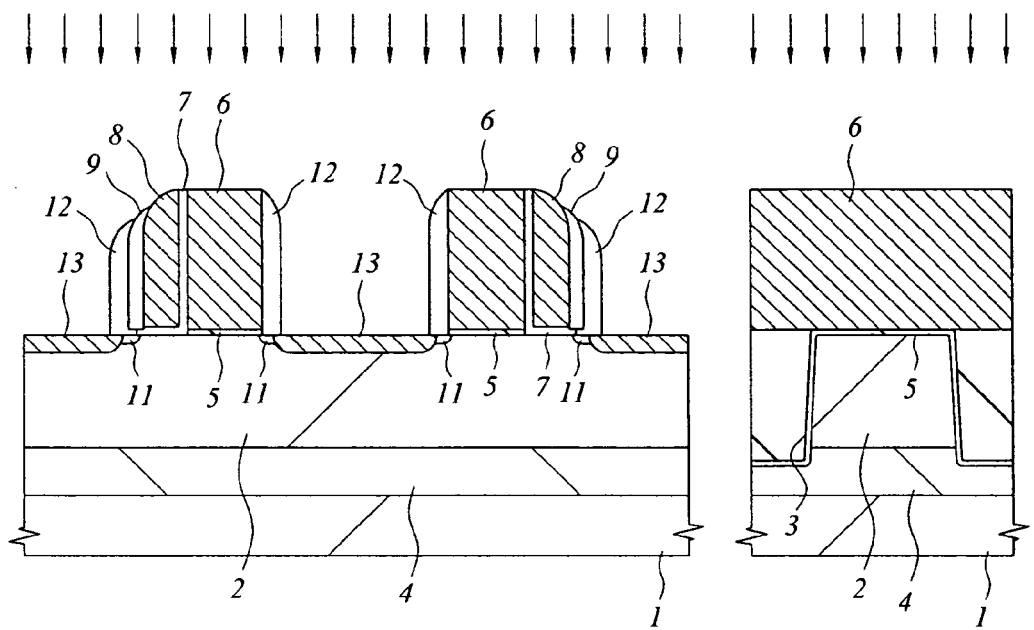
FIG. 14 is a cross-sectional view of principal parts showing the method of fabricating the MONOS nonvolatile memory subsequent to FIG. 13.

As shown in FIG. 14, impurity (phosphorus or arsenic) ions are implanted into the substrate 1, thereby forming the n⁺-type semiconductor region 13 (source and/or drain). The n⁺-type semiconductor region 13 on the memory gate 8 side is formed in a self-aligned fashion using the memory gate 8 and the silicon dioxide layers 9 and 12 on the side surface of the memory gate 8 as a mask. Accordingly, the n⁺-type semiconductor region 13 and the memory gate 8 are formed to be isolated from each other by as much as thicknesses of the silicon dioxide layers 9 and 12. Furthermore, the end of the ONO layer 7 is located not just under the memory gate 8 but just under the silicon dioxide layer 9. Due to this, when the silicon dioxide layer 12 is deposited, a low breakdown voltage region is not generated in the silicon dioxide layer 12 near the end of the memory gate 8. It is thereby possible to prevent the short-circuit between the memory gate 8 and the n⁺-type semiconductor region 13 caused by dielectric breakdown even if a high potential difference is generated between the memory gate 8 and the n⁺-type semiconductor region 13.

Figure 15:
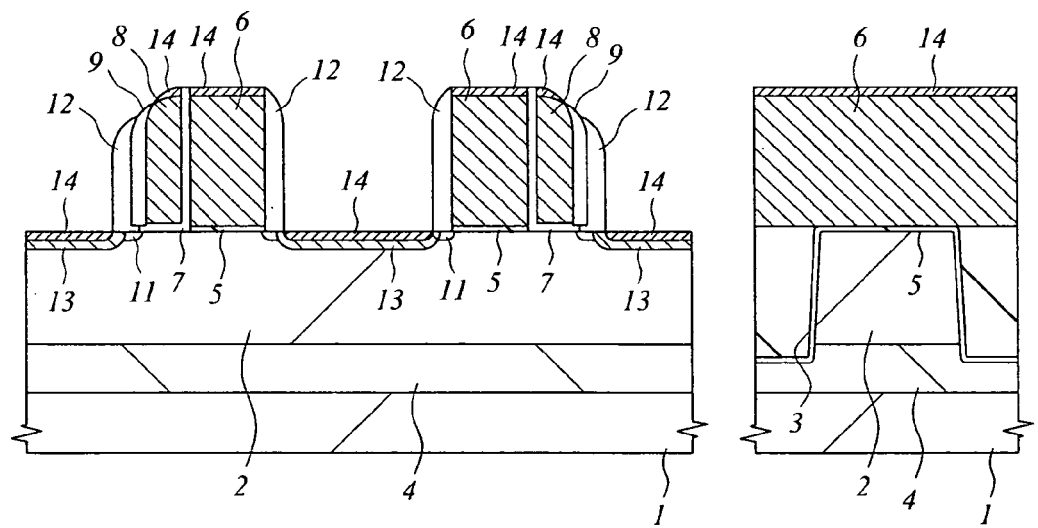
FIG. 15 is a cross-sectional view of principal parts showing the method of fabricating the MONOS nonvolatile memory subsequent to FIG. 14.

As shown in FIG. 15, the Co silicide layer 14 is formed on surfaces of the selective gate 6, the memory gate 8, and the n⁺-type semiconductor region 13. To form the Co silicide layer 14, a Co layer is deposited on the substrate 1 by sputtering, then, the substrate 1 is subjected to a heat treatment to react the Co layer with silicon (in the substrate 1, the selective gate 6, and the memory gate 8), and the remaining Co layer is etched and removed.

Next, the silicon nitride layer 20 and the silicon dioxide layer 21 are deposited on the substrate 1 by the CVD, and the silicon nitride layer 20 and the silicon dioxide layer 21 are then etched to form the contact hole 18. After forming the plug 19 in the contact hole 18, the bit line BL is formed on the silicon dioxide layer 21, thereby completing the memory cell $MC_1$ or $MC_2$ shown in FIGS. 1 and 2. Thereafter, a plurality of metal wirings is formed above the bit line BL through an interlayer insulating layer, which will not be described herein.

The semiconductor device thus fabricated is configured so that the end of the ONO film 7 protrudes outside of the end of the memory gate 8 as shown in FIG. 15. Namely, even if a high potential difference is generated between the memory gate 8 and the $n^+$-type semiconductor region 13, the short-circuit between the memory gate 8 and the $n^+$-type semiconductor region 13 caused by the dielectric breakdown can be prevented.

Moreover, even if the ONO layer is to be removed using isotropic etching for forming the silicon dioxide layer 9 that functions as a mask on the side surface of the memory gate, it is possible to leave the ONO layer below the memory gate.

Figure 16:
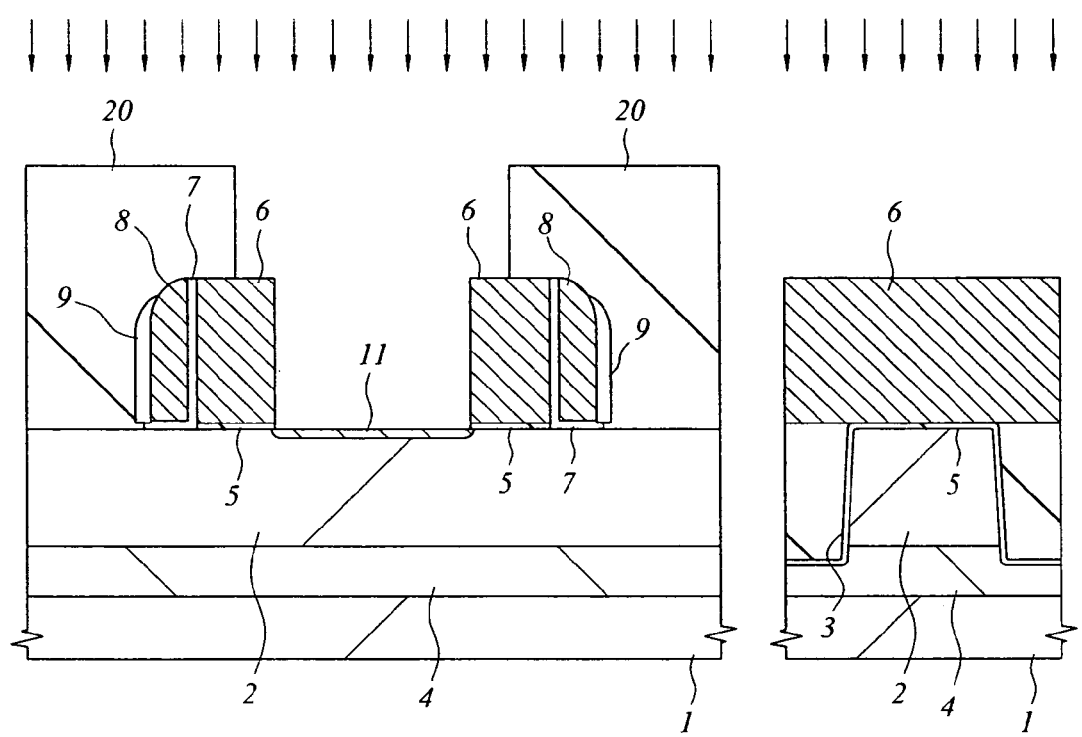
FIG. 16 is a cross-sectional view of principal parts showing a method of fabricating a MONOS nonvolatile memory according to another embodiment of the present invention.
Figure 17:
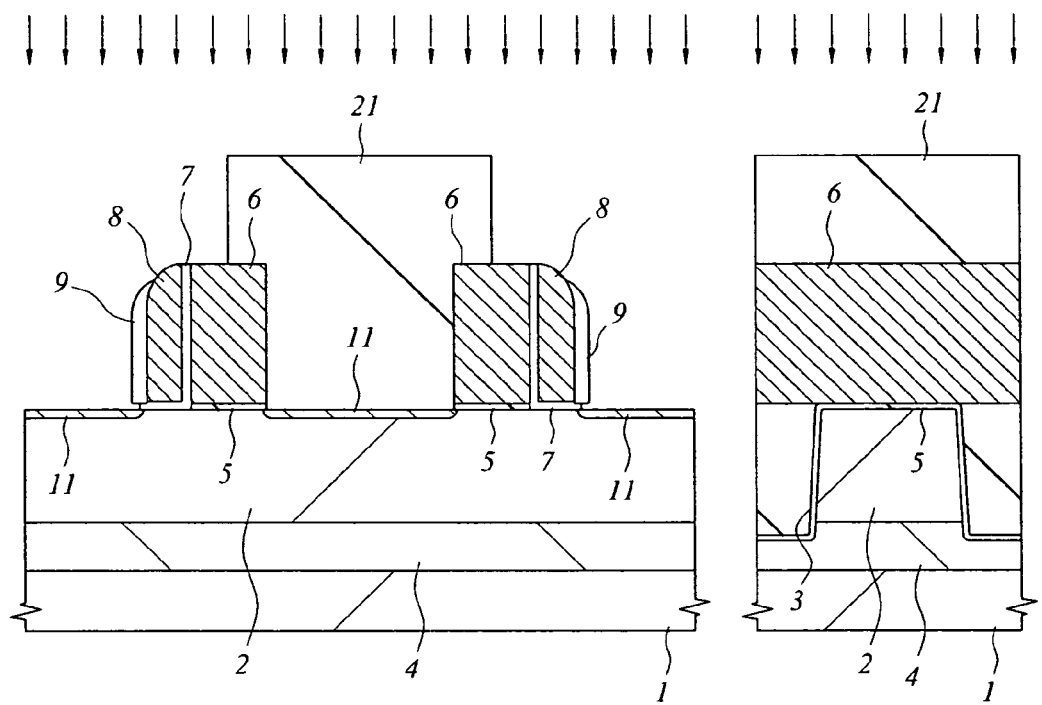
FIG. 17 is a cross-sectional view of principal parts showing the method of fabricating the MONOS nonvolatile memory subsequent to FIG. 16.

In the above-stated fabrication method, when impurities are implanted into the substrate 1 to form the $n^-$-type semiconductor region 11 (see FIG. 12), the $n^-$-type semiconductor region 11 on the selective gate 6 side and that on the memory gate 8 side are simultaneously formed. Alternatively, for example, as shown in FIGS. 16 and 17, impurity ion implantation can be performed twice using two types of photoresist layers 20 and 21, and the $n^-$-type semiconductor region 11 on the selective gate 6 side and that on the memory gate 8 side can be formed at different steps. In this alternative, impurity concentrations of the $n^-$-type semiconductor region 11 can be optimized on the selective gate 6 side and the memory gate 8 side, respectively.

Second Embodiment

In the first embodiment, the impurity ions are implanted into the substrate 1 to form the $n^-$-type semiconductor region 11 as shown in FIG. 12, and the silicon dioxide layer 12 is then formed on one side surface of each of the selective gate 6 and the memory gate 8 as shown in FIG. 13.

Figure 18:
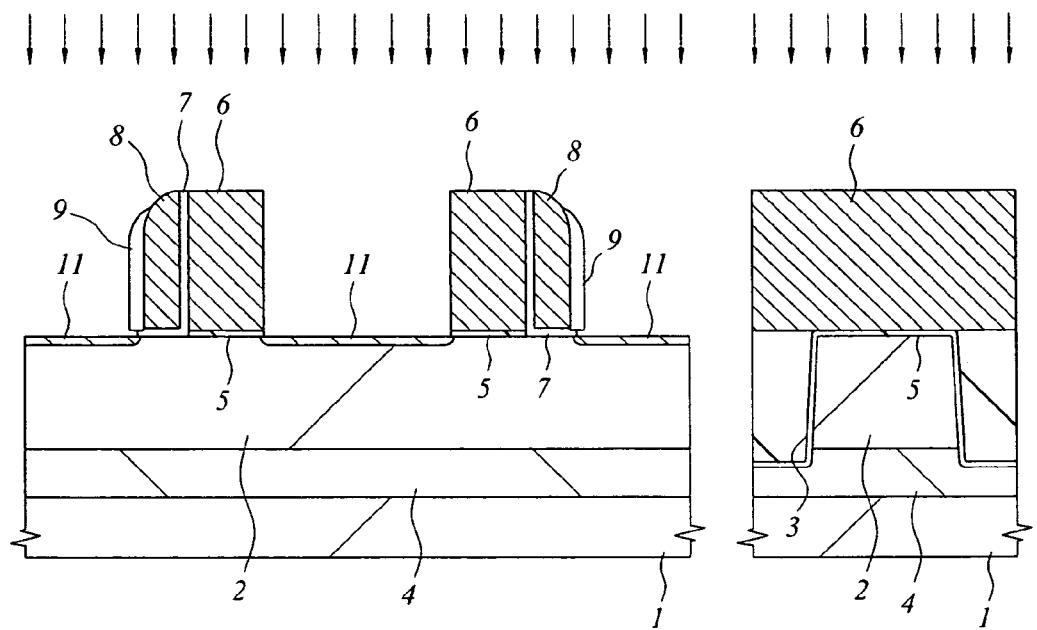
FIG. 18 is a cross-sectional view of principal parts showing a method of fabricating a MONOS nonvolatile memory according to another embodiment of the present invention.
Figure 19:
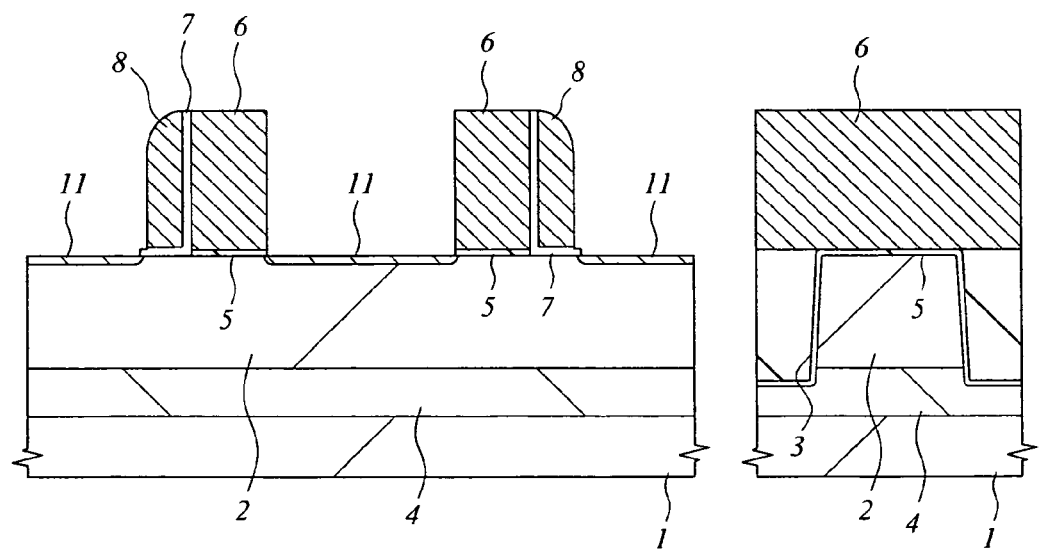
FIG. 19 is a cross-sectional view of principal parts showing the method of fabricating the MONOS nonvolatile memory subsequent to FIG. 18.

In a second embodiment, by contrast, impurity ions are implanted into the substrate 1 to form the $n^-$-type semiconductor region 11 as shown in FIG. 18, and the silicon dioxide layer 9 formed on side surface of the memory gate 8 is then etched and removed as shown in FIG. 19.

Figure 20:
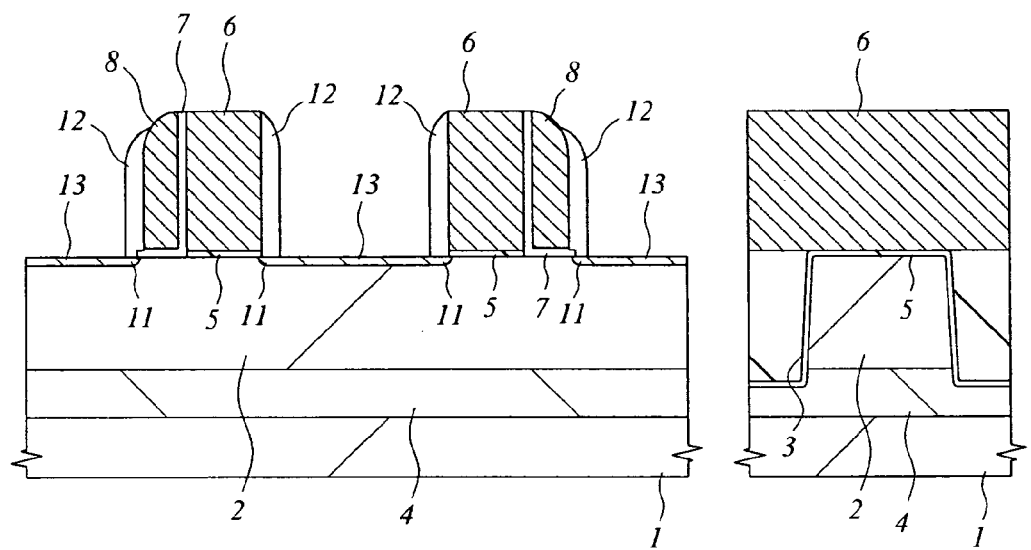
FIG. 20 is a cross-sectional view of principal parts showing the method of fabricating the MONOS nonvolatile memory subsequent to FIG. 19.
Figure 21:
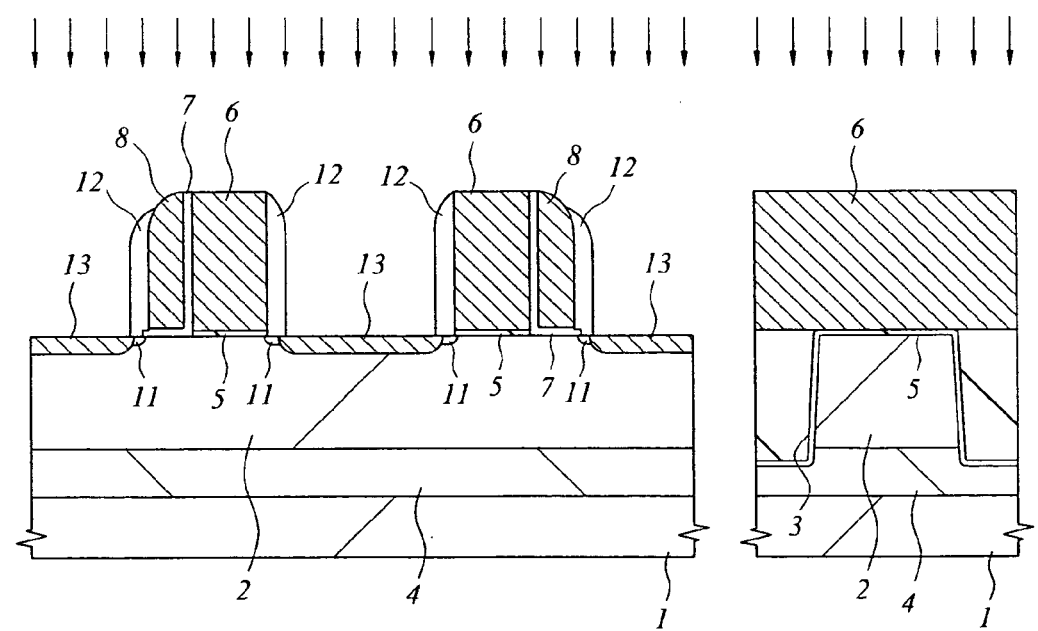
FIG. 21 is a cross-sectional view of principal parts showing the method of fabricating the MONOS nonvolatile memory subsequent to FIG. 20.

As shown in FIG. 20, the sidewall-shaped silicon dioxide layer 12 is formed on one side surface of each of the selective gate 6 and the memory gate 8. Thereafter, as shown in FIG. 21, impurity ions are implanted into the substrate 1, thereby forming the $n^+$-type semiconductor region 13 (source and/or drain). Subsequent steps are identical to those according to the first embodiment.

In a semiconductor device fabricated by a fabrication method according to the second embodiment, the $n^+$-type semiconductor region 13 (source and/or drain) is formed after removal of the silicon dioxide layer 9, whereby the $n^+$-type semiconductor region 13 on the memory gate 8 side can be formed to be close to the memory gate 8, as compared with the first embodiment. Furthermore, ends of the ONO layer 7 are located outside of the respective side surfaces of the memory gate 8, so that no low breakdown region is generated when the silicon dioxide layer 12 is deposited. It is thereby possible to prevent the short-circuit between the memory gate 8 and the $n^+$-type semiconductor region 13 caused by the dielectric breakdown even if a high voltage is applied between the memory gate 8 and the $n^+$-type semiconductor region 13.

Third Embodiment

Figure 22:
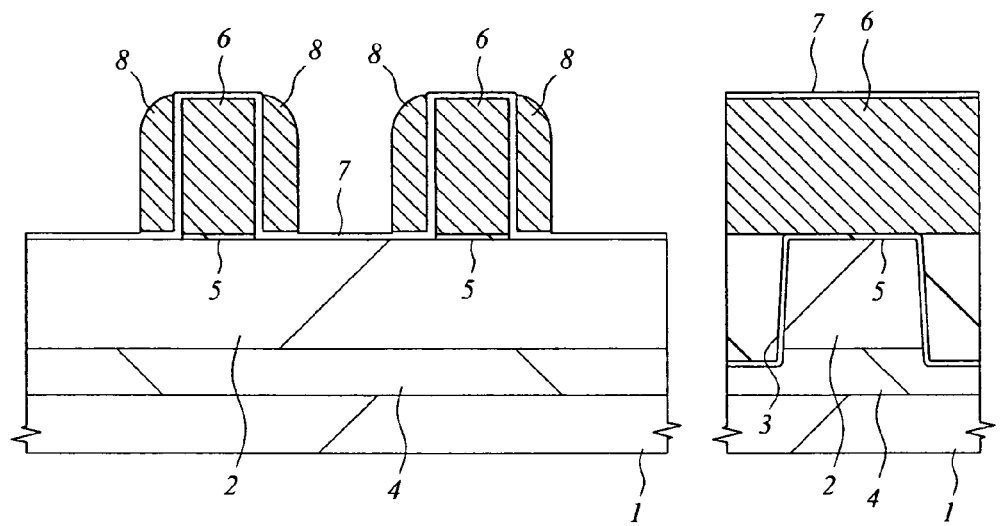
FIG. 22 is a cross-sectional view of principal parts showing a method of fabricating a MONOS nonvolatile memory according to another embodiment of the present invention.

As shown in FIG. 22, after the selective gate 6 and the ONO layer 7 are formed on the substrate 1, the n-type polycrystalline silicon layer deposited on the ONO layer 7 is anisotropically etched, thereby forming sidewall-shaped memory gates 8 on both side surfaces of the selective gate 6, respectively. The steps until forming the sidewall-shaped memory gates 8 are identical to those according to the first embodiment as shown in FIGS. 3 to 7.

Figure 23:
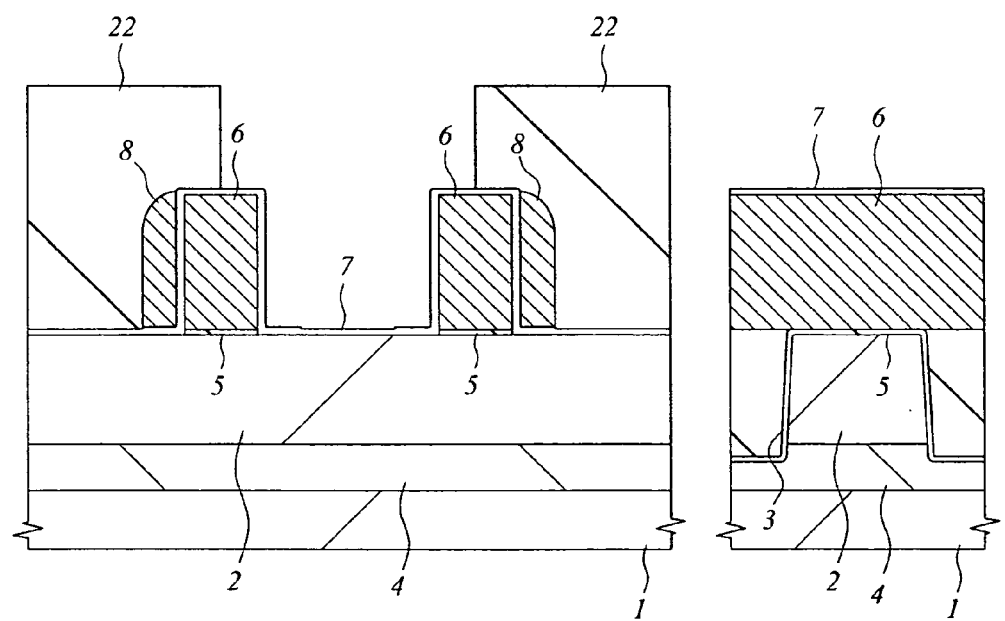
FIG. 23 is a cross-sectional view of principal parts showing the method of fabricating the MONOS nonvolatile memory subsequent to FIG. 22.

In a third embodiment, one of the memory gates 8 formed on the respective side surfaces of the selective gate 6 is covered with a photoresist layer 22, and the other memory gate 8 is etched and removed, thereby leaving the memory gate 8 on one side surface of the selective gate as shown in FIG. 23.

Figure 24:
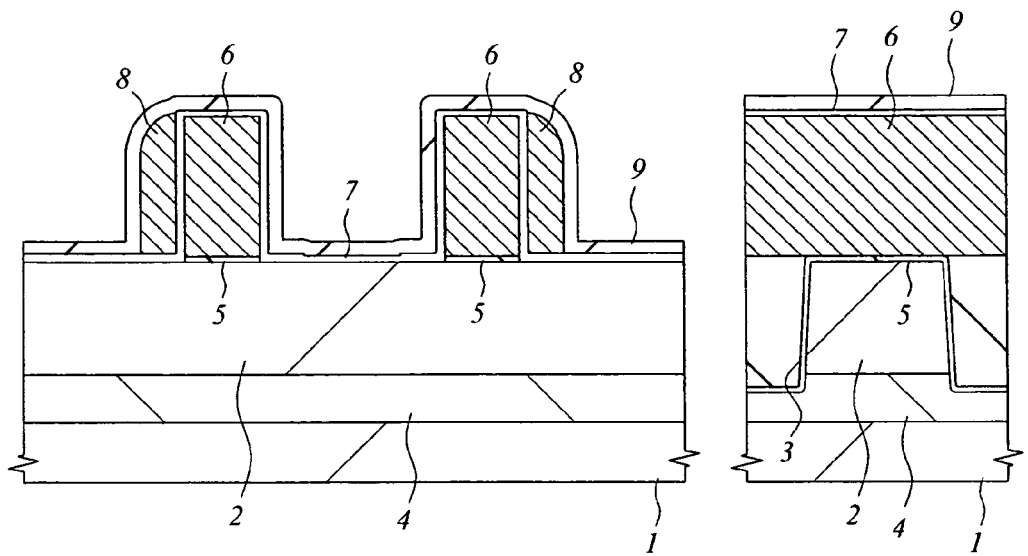
FIG. 24 is a cross-sectional view of principal parts showing the method of fabricating the MONOS nonvolatile memory subsequent to FIG. 23.
Figure 25:
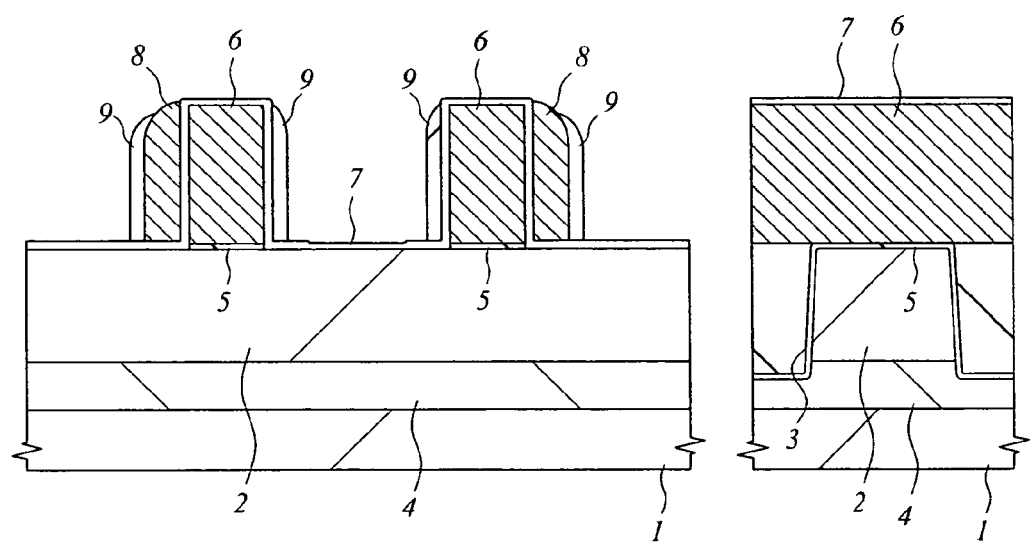
FIG. 25 is a cross-sectional view of principal parts showing the method of fabricating the MONOS nonvolatile memory subsequent to FIG. 24.

As shown in FIG. 24, after depositing the silicon dioxide layer 9 on the substrate 1, the silicon dioxide layer 9 is anisotropically etched. Sidewall-shaped silicon dioxide layers 9 are thereby left on side surfaces of the memory gate 8 and those of the selective gate 6 as shown in FIG. 25.

Figure 26:
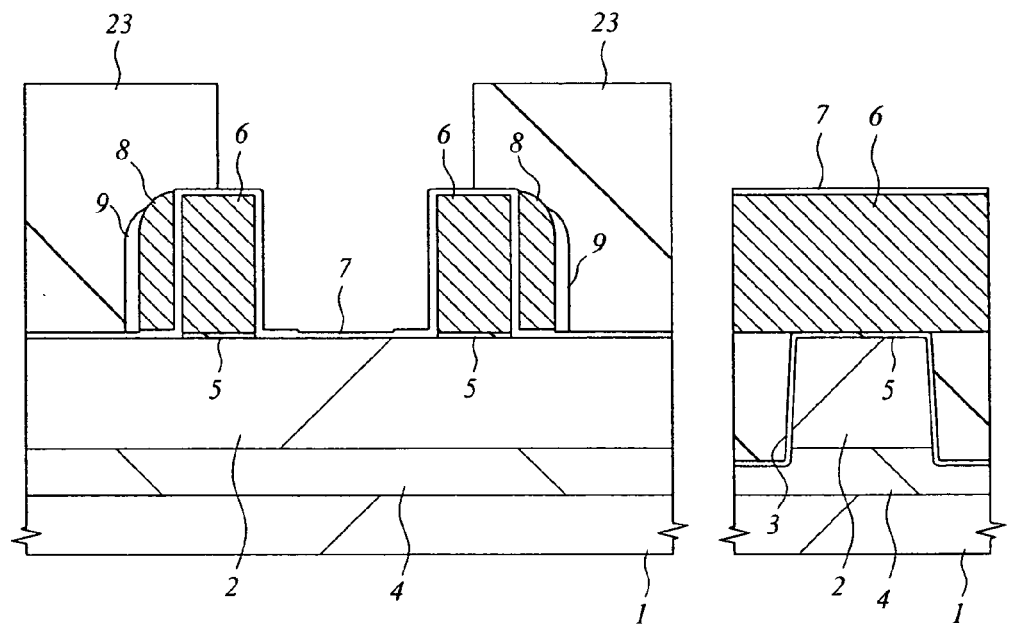
FIG. 26 is a cross-sectional view of principal parts showing the method of fabricating the MONOS nonvolatile memory subsequent to FIG. 25.
Figure 27:
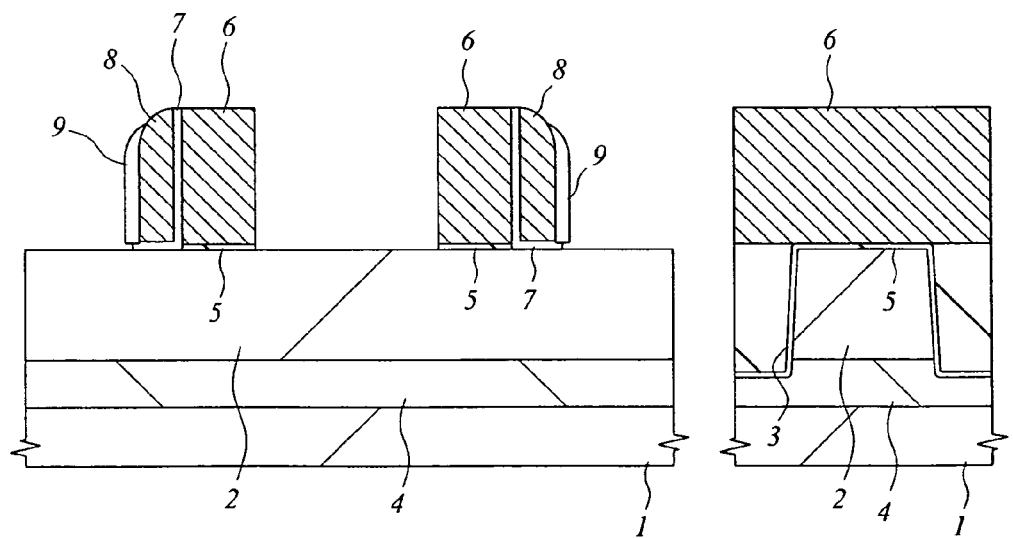
FIG. 27 is a cross-sectional view of principal parts showing the method of fabricating the MONOS nonvolatile memory subsequent to FIG. 26.

As shown in FIG. 26, the silicon dioxide layer 9 on the side surfaces of the selective gate 6 is etched and removed using a photoresist layer 23 as a mask. After the photoresist layer 23 is removed, the unnecessary ONO layer 7 left on the upper surface, one side surface and the like of the selective gate 6 is etched and removed, as shown in FIG. 27. Similarly to the first embodiment, in order to remove the ONO layer 7, the wet etching with which the ONO layer 7 can be isotropically etched is used. Subsequent steps are identical to those according to the first embodiment.

In the first embodiment, when the memory gate 8 on one side surface of the selective gate 6 is etched and removed (see FIG. 10), the silicon dioxide layer 9 on the side surface of the memory gate 8 is also removed simultaneously with the memory gate 8. Namely, the memory gate 8 and the silicon dioxide layer 9 different in etching selectivity rate are simultaneously removed, resulting in complicated process management. In the third embodiment, by contrast, the memory gate 8 and the silicon dioxide layer 9 are removed at different steps, thereby making the complicated process management unnecessary.

Fourth Embodiment

Figure 9:
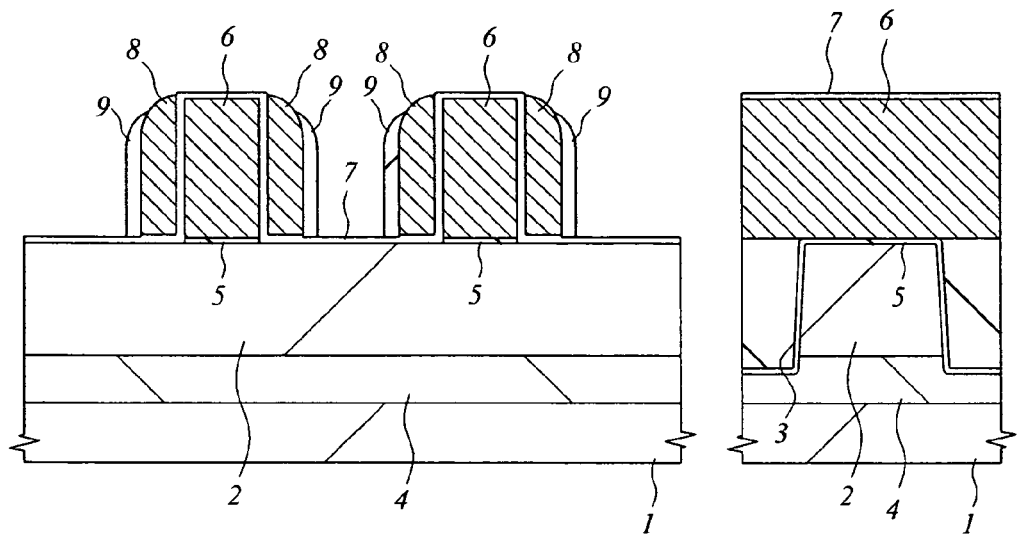
FIG. 9 is a cross-sectional view of principal parts showing the method of fabricating the MONOS nonvolatile memory subsequent to FIG. 8.

In the first embodiment, after the memory gates 8 are formed on the respective both side surfaces of the selective gate 6 as shown in FIG. 7, the silicon dioxide layer 9 deposited on the substrate 1 is anisotropically etched as shown in FIGS. 8 and 9, thereby leaving the sidewall-shaped silicon dioxide layer 9 on each side surface of the selective gate 6.

Figure 28:
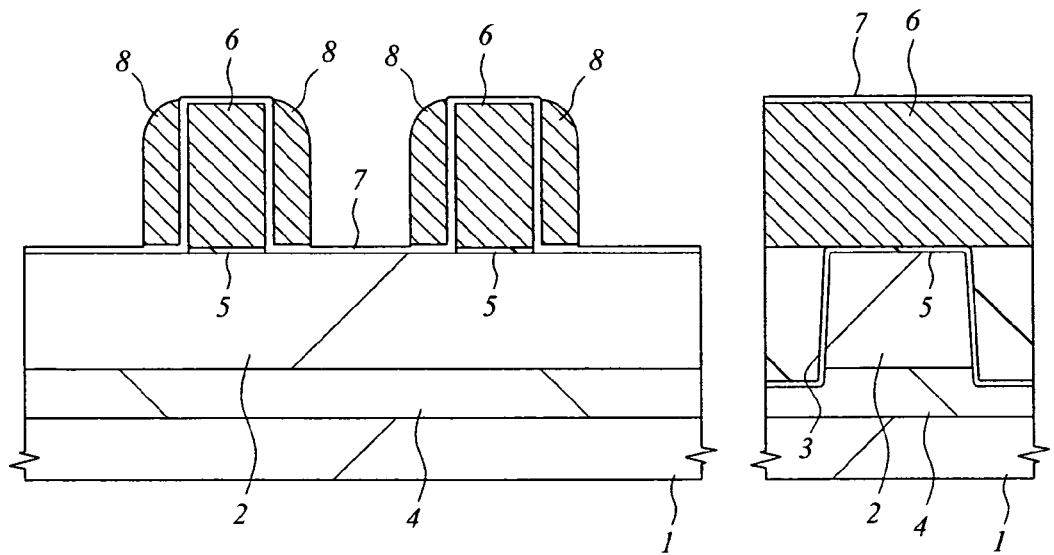
FIG. 28 is a cross-sectional view of principal parts showing a method of fabricating a MONOS nonvolatile memory according to another embodiment of the present invention.
Figure 29:
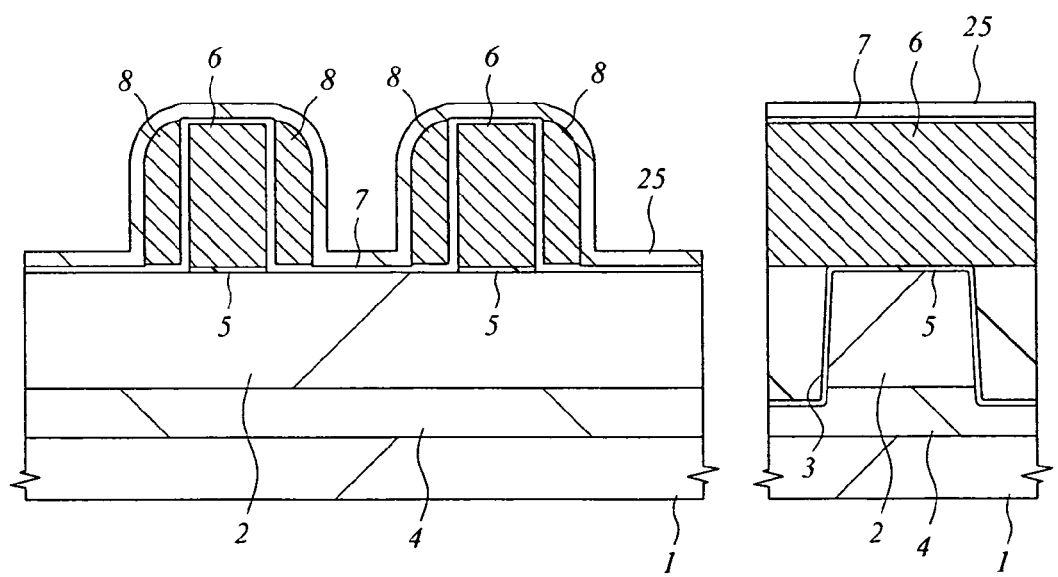
FIG. 29 is a cross-sectional view of principal parts showing the method of fabricating the MONOS nonvolatile memory subsequent to FIG. 28.
Figure 30:
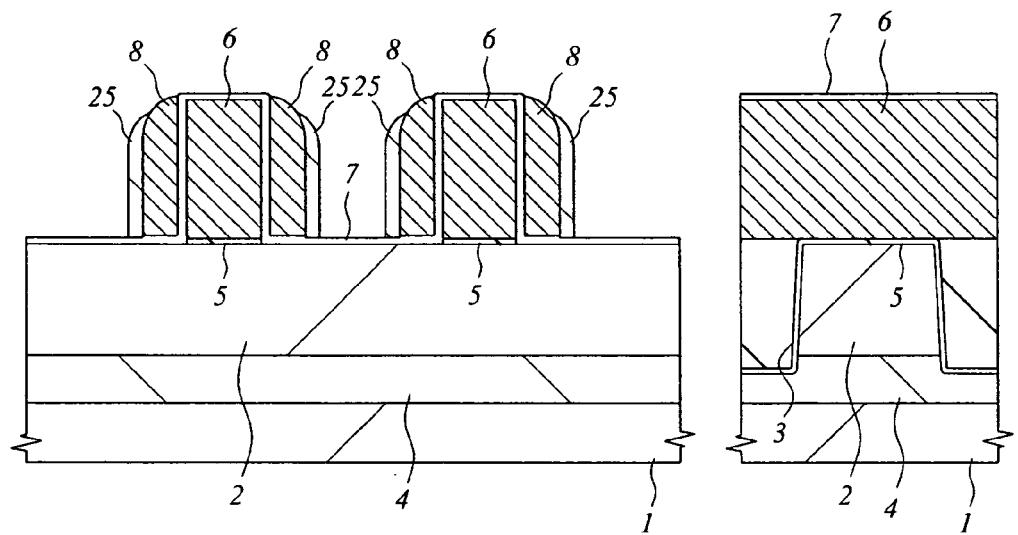
FIG. 30 is a cross-sectional view of principal parts showing the method of fabricating the MONOS nonvolatile memory subsequent to FIG. 29.

In a fourth embodiment, by contrast, after forming memory gates 8 on the respective both side surfaces of the selective gate 6 as shown in FIG. 28, a polycrystalline silicon layer 25 having a thickness of about 20 nanometers is deposited on the substrate 1 by the CVD as shown in FIG. 29. Next, the polycrystalline silicon layer 25 is anisotropically etched, thereby leaving the sidewall-shaped polycrystalline silicon layer 25 on each side surface of the selective gate 6 as shown in FIG. 30. In the first embodiment, the silicon dioxide layer 9 is formed on each side surface of the selective gate 6. In the fourth embodiment, by contrast, the polycrystalline silicon layer 25 is formed on each side surface of the selective gate 6.

Figure 31:
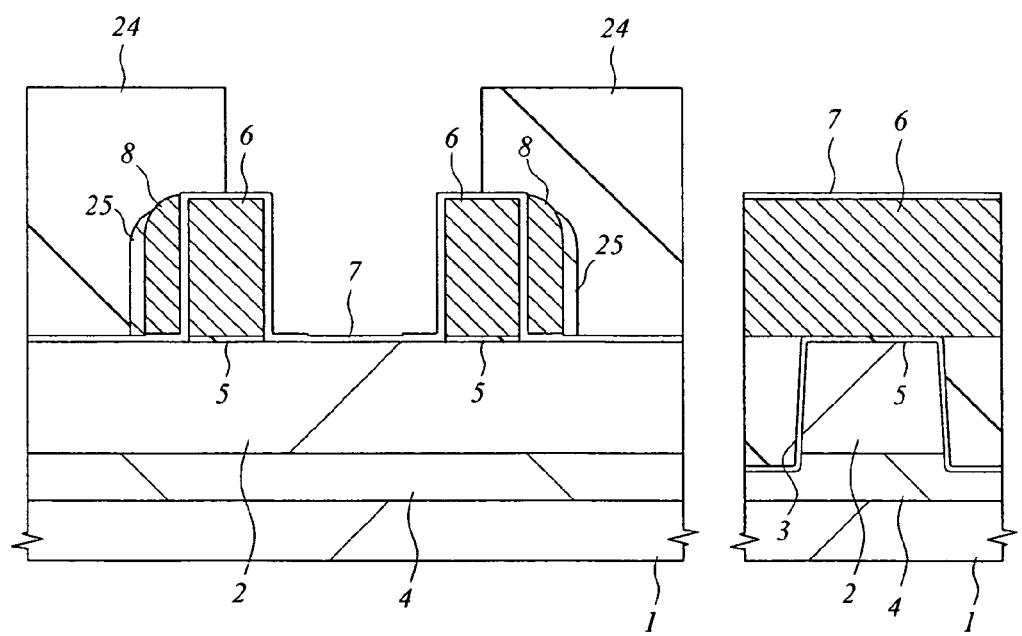
FIG. 31 is a cross-sectional view of principal parts showing the method of fabricating the MONOS nonvolatile memory subsequent to FIG. 30.

As shown in FIG. 31, one of the memory gates 8 formed on the respective both side surfaces of the selective gate 6 is covered with a photoresist layer 24, and the other memory gate 8 as well as the polycrystalline silicon layer 25 on the side surface of the memory gate 8 is etched and removed, thereby leaving the memory gate 8 on one side surface of the selective gate 6. Subsequent steps are identical to those according to the first embodiment.

In the first embodiment, when the memory gate 8 on one side surface of the selective gate 6 is etched and removed (see FIG. 10), the silicon dioxide layer 9 on the side surface of the memory gate 8 is also removed simultaneously with the memory gate 8. Namely, the memory gate 8 and the silicon dioxide layer 9 different in etching selectivity rate are simultaneously removed, resulting in complicated process management. In the fourth embodiment, by contrast, the memory gate 8 and the polycrystalline silicon layer 25 on the side surface of the memory gate 8 are made of the same material, thereby making the complicated process management unnecessary.

If the polycrystalline 25 containing impurities is formed on each of the side surfaces of the selective gate 6 constituted by the n-type polycrystalline silicon layer, when a voltage is applied to the selective gate 6, the voltage is also applied to the polycrystalline silicon layer 25. Namely, the polycrystalline silicon layer 25 substantially functions as a part of the selective gate 6. Therefore, a high potential difference is generated between the polycrystalline silicon layer 25 and the $n^+$-type semiconductor region 13, and a strong voltage is applied to the low breakdown voltage region.

It is, therefore, preferable to constitute the polycrystalline silicon layer 25 by undoped polycrystalline silicon into which no impurities are implanted. In this case, the voltage applied to the selective gate 6 is not applied to the polycrystalline silicon layer 25, so that strong voltage is never applied to the low breakdown voltage region. Moreover, prior to the step of depositing the polycrystalline silicon layer 25 on the substrate 1 (see FIG. 29), a native oxide layer or a thin silicon dioxide layer can be formed on the surfaces of the memory gate 8. If so, a thin silicon dioxide layer is formed on an interface between the memory gate 8 and the polycrystalline silicon layer 25. It is, therefore, possible to suppress diffusion of impurities in the memory gate 8 into the polycrystalline silicon layer 25.

Fifth Embodiment

In the first to fourth embodiments, the MONOS nonvolatile memory having the split gate structure including the selective gate 5 and the memory gate 6 has been described. However, the present invention is also applicable to a MONOS nonvolatile memory including a single memory gate.

Figure 32:
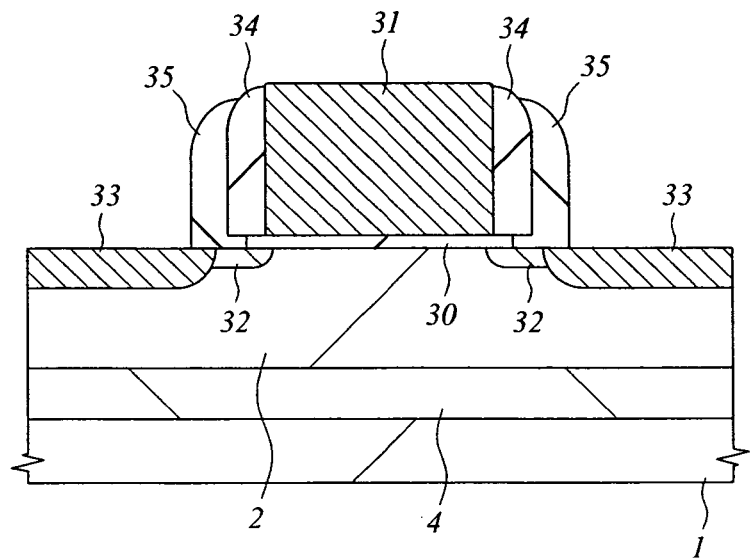
FIG. 32 is a cross-sectional view of principal parts showing a method of fabricating a MONOS nonvolatile memory according to another embodiment of the present invention.

FIG. 32 is a cross-sectional view of a MONOS nonvolatile memory including a single memory gate 31. In FIG. 32, reference symbol 30 denotes an ONO layer 30 that constitutes a gate insulating film, 32 denotes an $n^-$-type semiconductor region that constitutes an extension region for relaxing high electric field, 33 denotes an $n^+$-type semiconductor region that constitutes a source or a drain of a transistor, and 34 and 35 denote sidewall-shaped silicon dioxide layers formed on side surfaces of the memory gate 31, respectively. The silicon dioxide layer 34 corresponds to the silicon dioxide layer 12 according to the first to fourth embodiments, and the silicon dioxide layer 35 corresponds to the silicon dioxide layer 12 according to the first to fourth embodiments.

Figure 33:
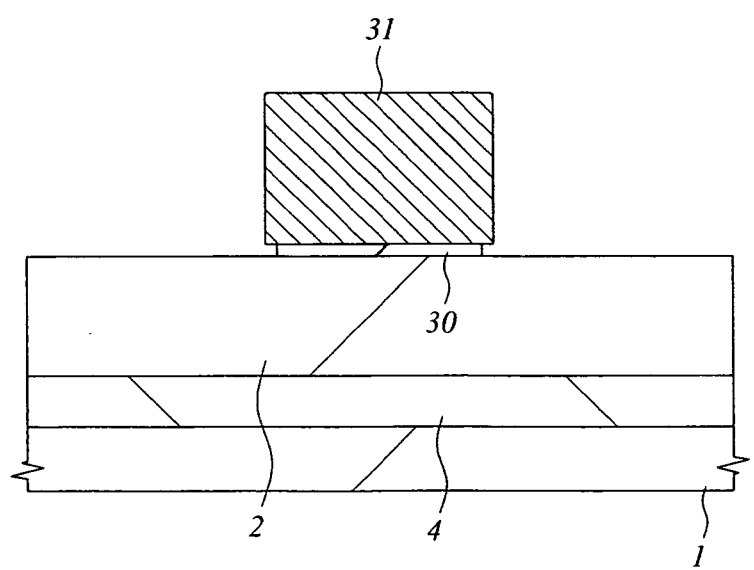
FIG. 33 is a cross-sectional view of principal parts showing the method of fabricating the MONOS nonvolatile memory subsequent to FIG. 32.

To form the memory cell thus configured, after the ONO layer 30 is formed on the substrate 1, an n-type polycrystalline silicon layer deposited on the ONO layer 30 is patterned to form the memory gate 31. Next, the ONO layer 30 in regions other than the region below the memory gate 31 is etched and removed. However, if the ONO layer 30 is removed by dry etching, the substrate 1 is damaged by the etching. The ONO layer 30 is, therefore, removed by wet etching that does not damage the substrate 1. If so, as shown in FIG. 33, ends of the ONO layer 30 are side-etched and retreated inward with respect to the respective side surfaces of the memory gate 31. As a result, a short-circuit tends to occur between the memory gate 31 and the $n^+$-type semiconductor region 33 caused by the dielectric breakdown. To prevent the short-circuit, after the sidewall-shaped silicon dioxide layers 34 are formed on the respective side surfaces of the memory gate 31, the ONO layer 30 is wet-etched, as shown in FIG. 32.

Figure 34:
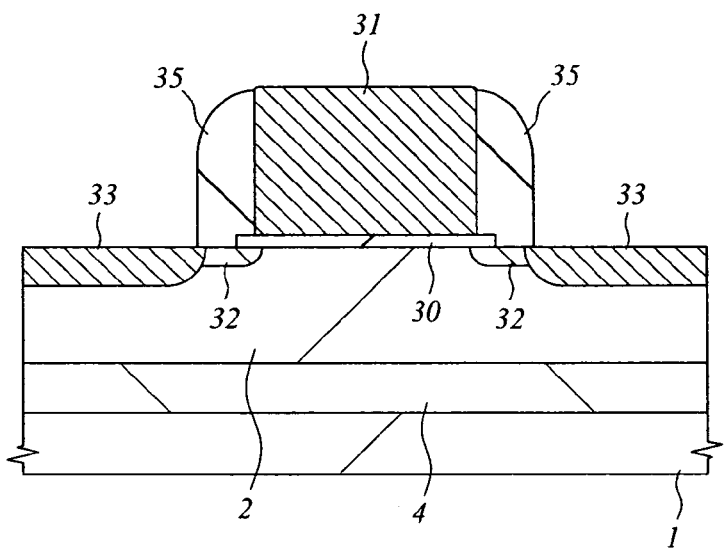
FIG. 34 is a cross-sectional view of principal parts showing the method of fabricating the MONOS nonvolatile memory subsequent to FIG. 33.
Figure 35:
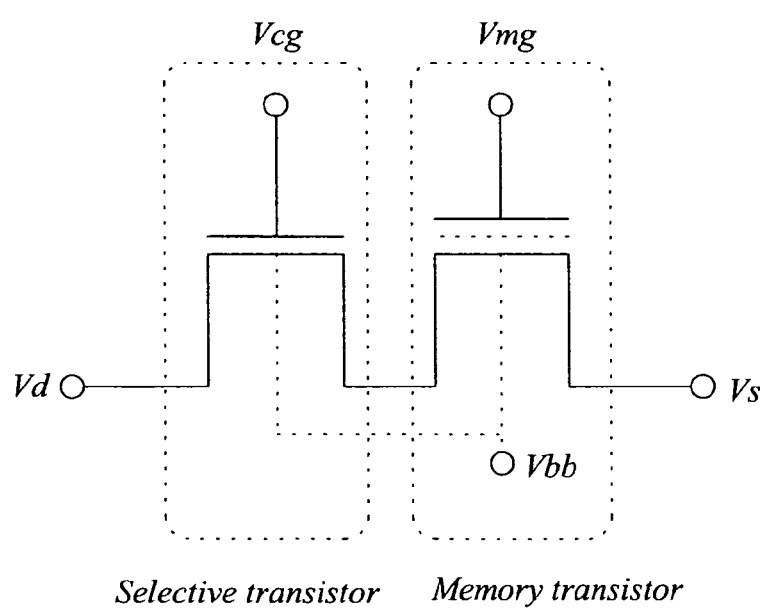
FIG. 35 is an equivalent circuit diagram showing a conventional MONOS nonvolatile memory.
Figure 36:
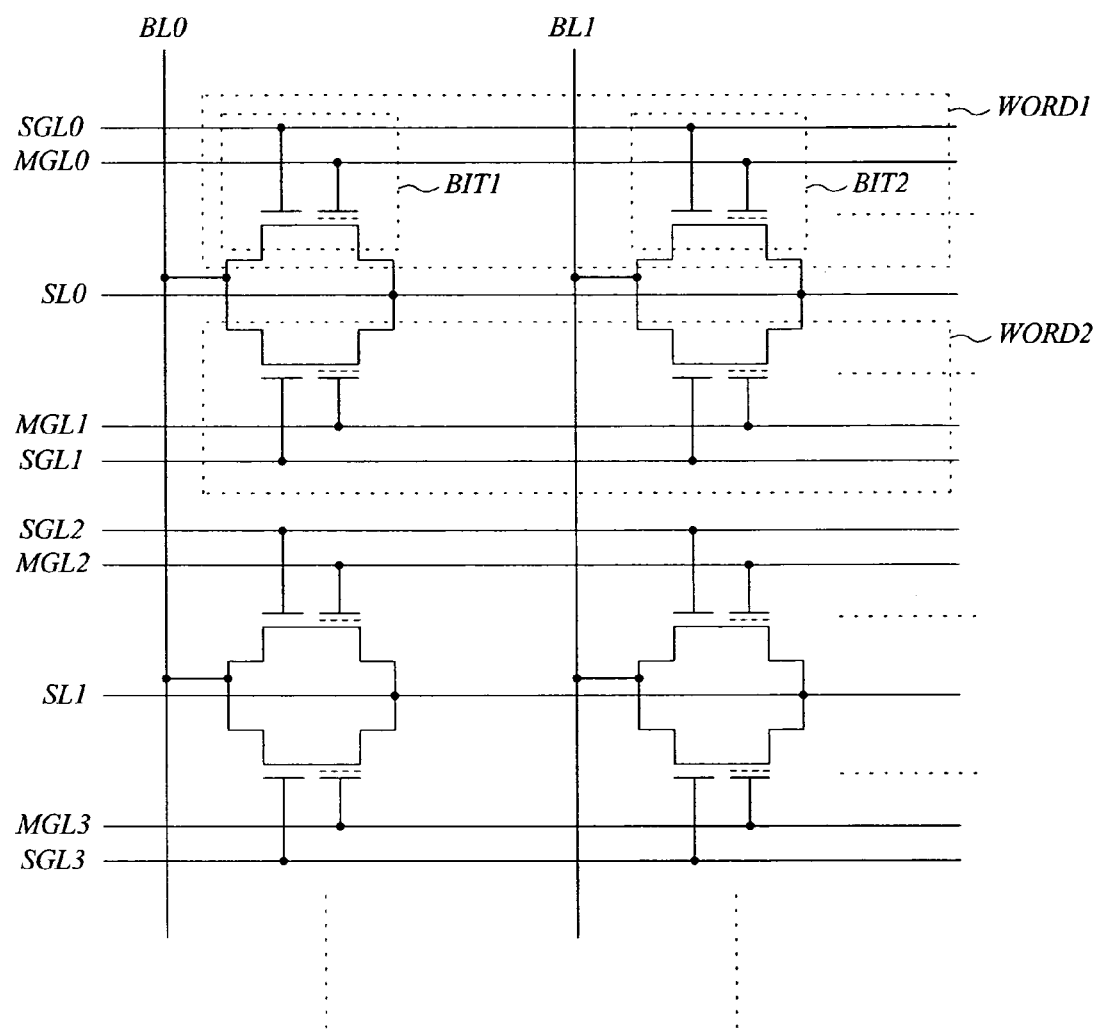
FIG. 36 is an equivalent circuit diagram of a memory array using the MONOS nonvolatile memory shown in FIG. 35.
Figure 37:
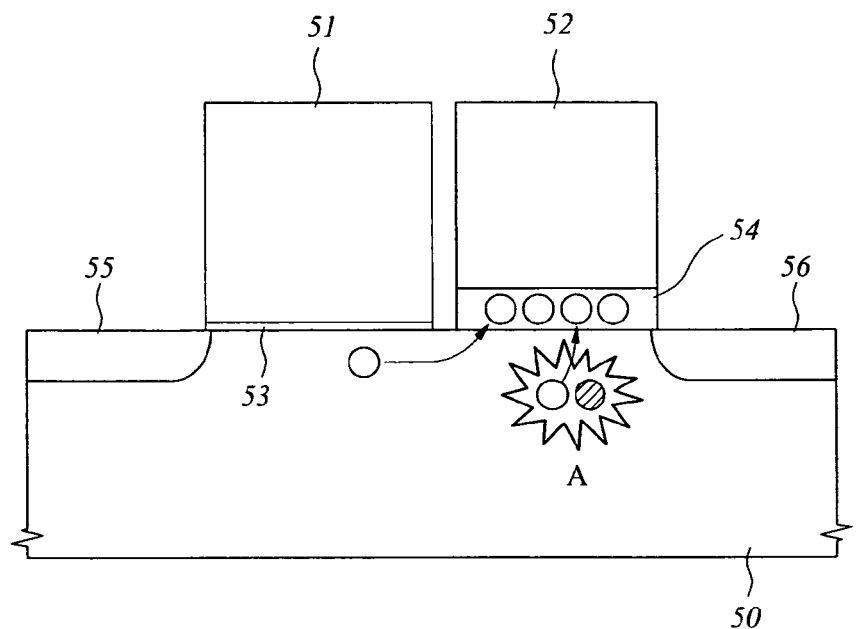
FIG. 37 is a pattern diagram for schematically explaining a write operation performed by the MONOS nonvolatile memory shown in FIG. 35.
Figure 38:
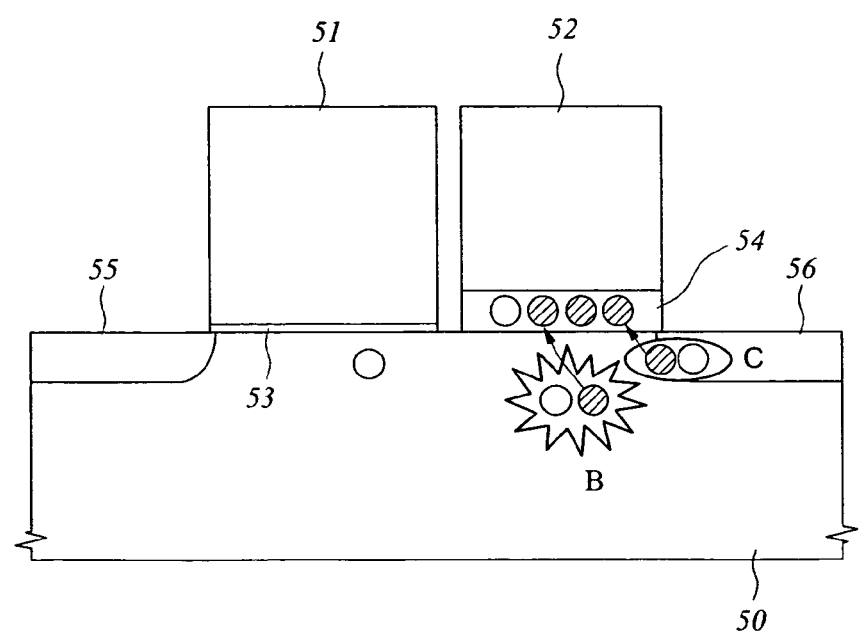
FIG. 38 is a pattern diagram for schematically explaining an erasing operation performed by the MONOS nonvolatile memory shown in FIG. 35.
Figure 39:
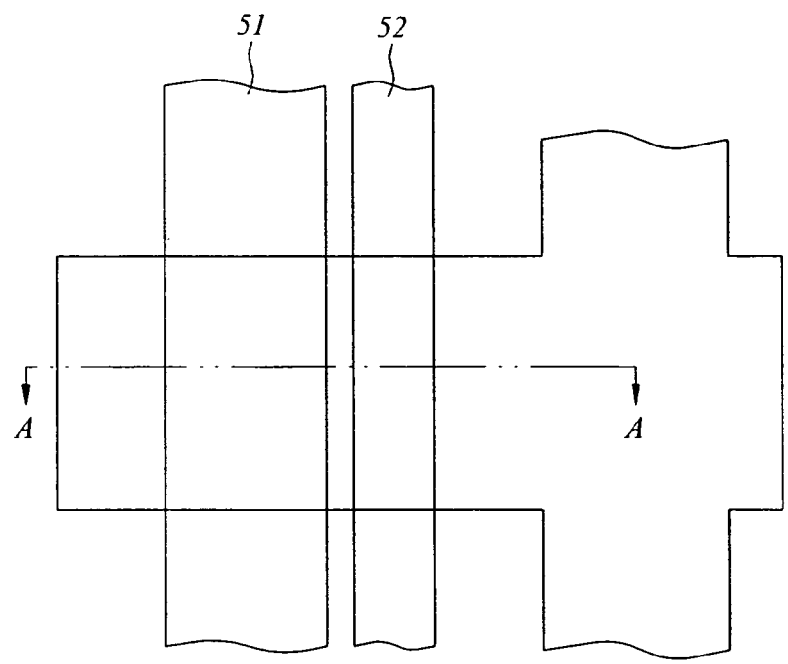
FIG. 39 is a plan view of the MONOS nonvolatile memory shown in FIG. 35.
Figure 40:
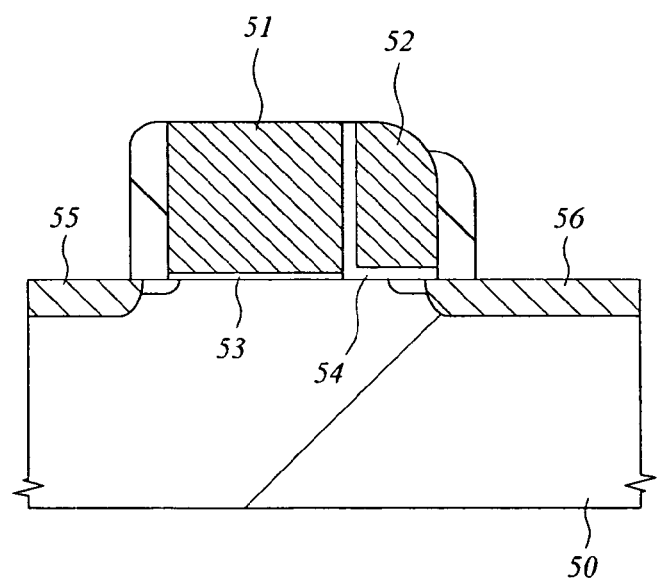
FIG. 40 is a cross-sectional view taken along a line A-A of FIG. 39.
Figure 41:
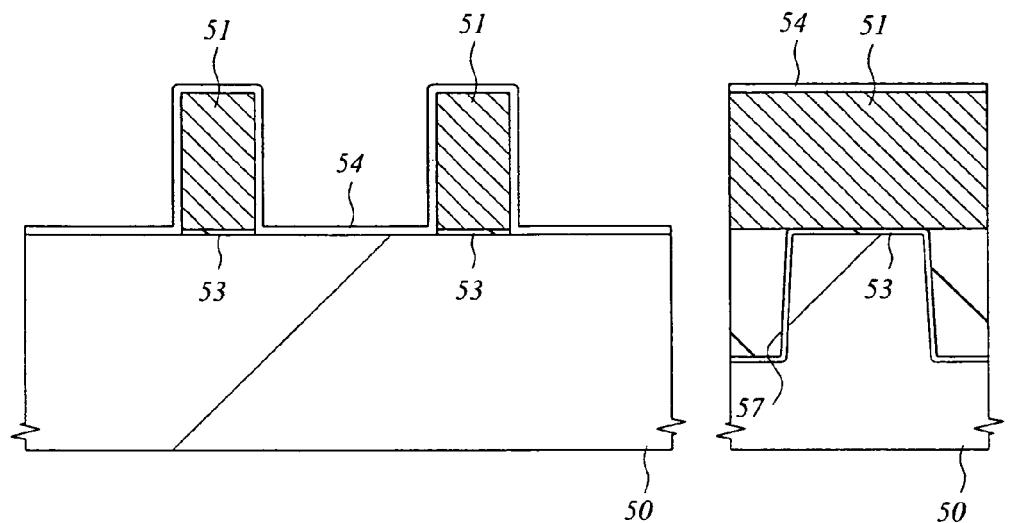
FIG. 41 is a cross-sectional view of principal parts showing a method of fabricating the MONOS nonvolatile memory shown in FIG. 35.
Figure 42:
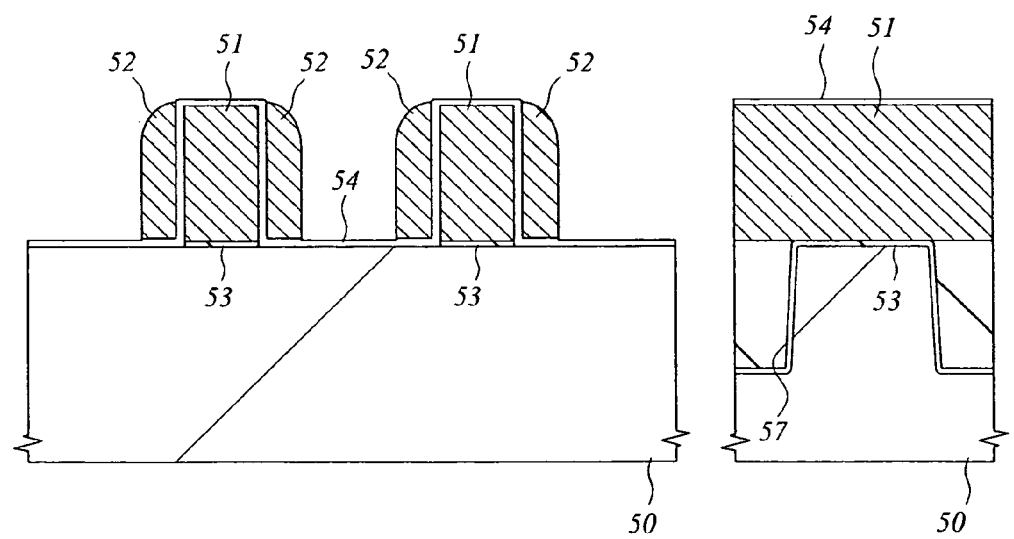
FIG. 42 is a cross-sectional view of principal parts showing the method of fabricating the MONOS nonvolatile memory subsequent to FIG. 41.
Figure 43:
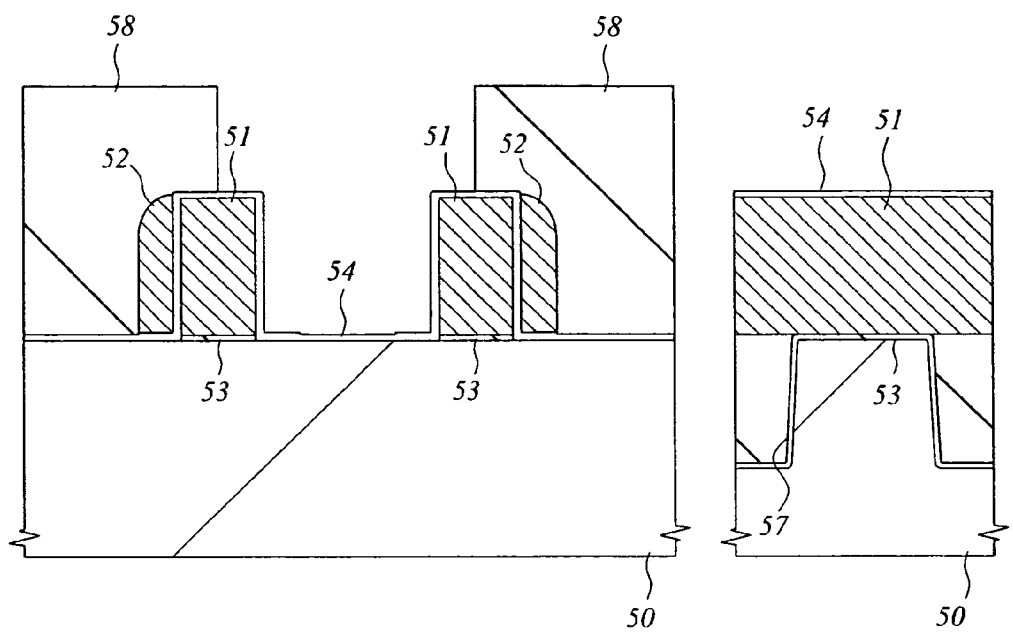
FIG. 43 is a cross-sectional view of principal parts showing the method of fabricating the MONOS nonvolatile memory subsequent to FIG. 42.
Figure 44:
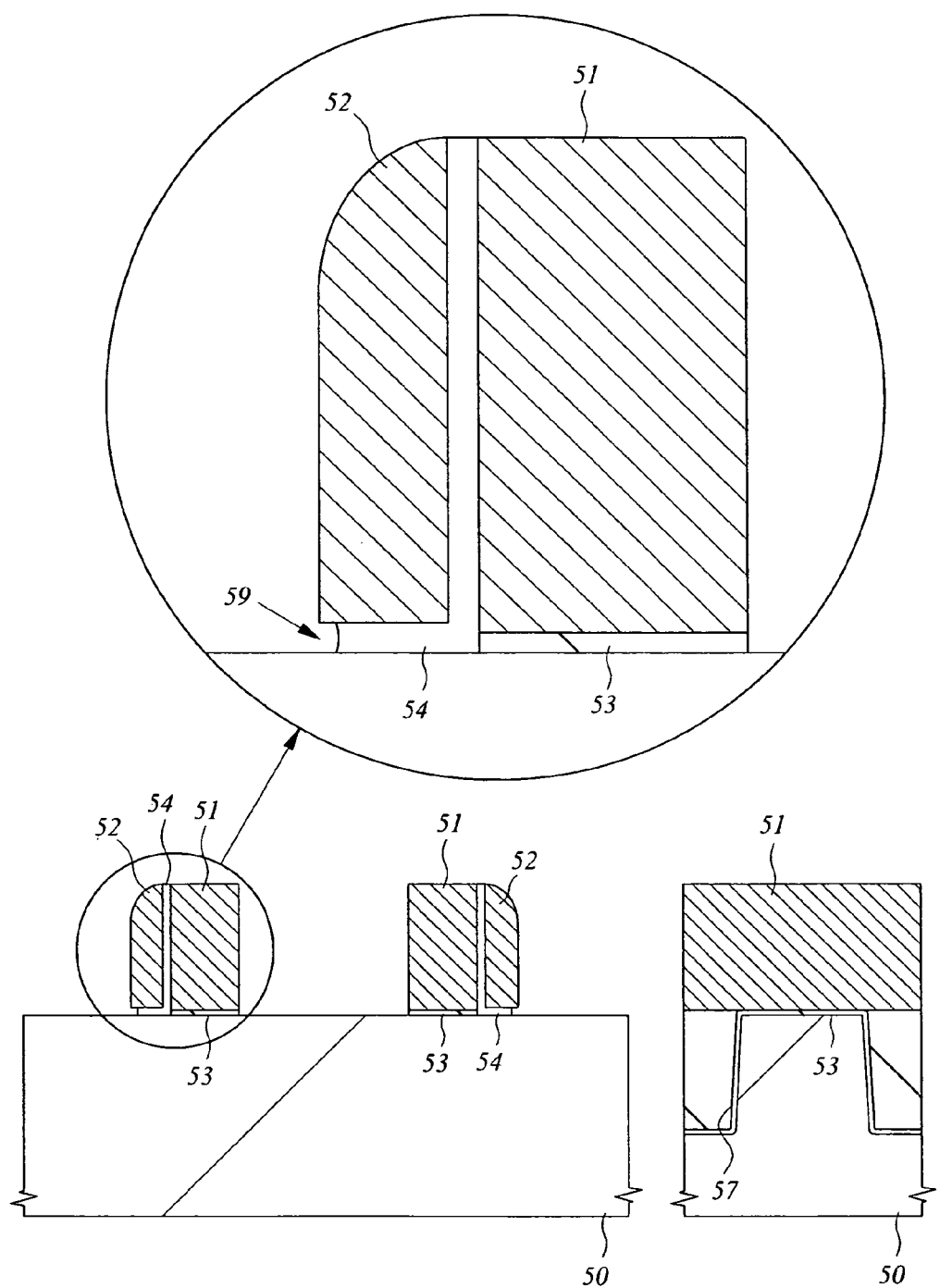
FIG. 44 is a cross-sectional view of principal parts showing the method of fabricating the MONOS nonvolatile memory subsequent to FIG. 43.
Figure 45:
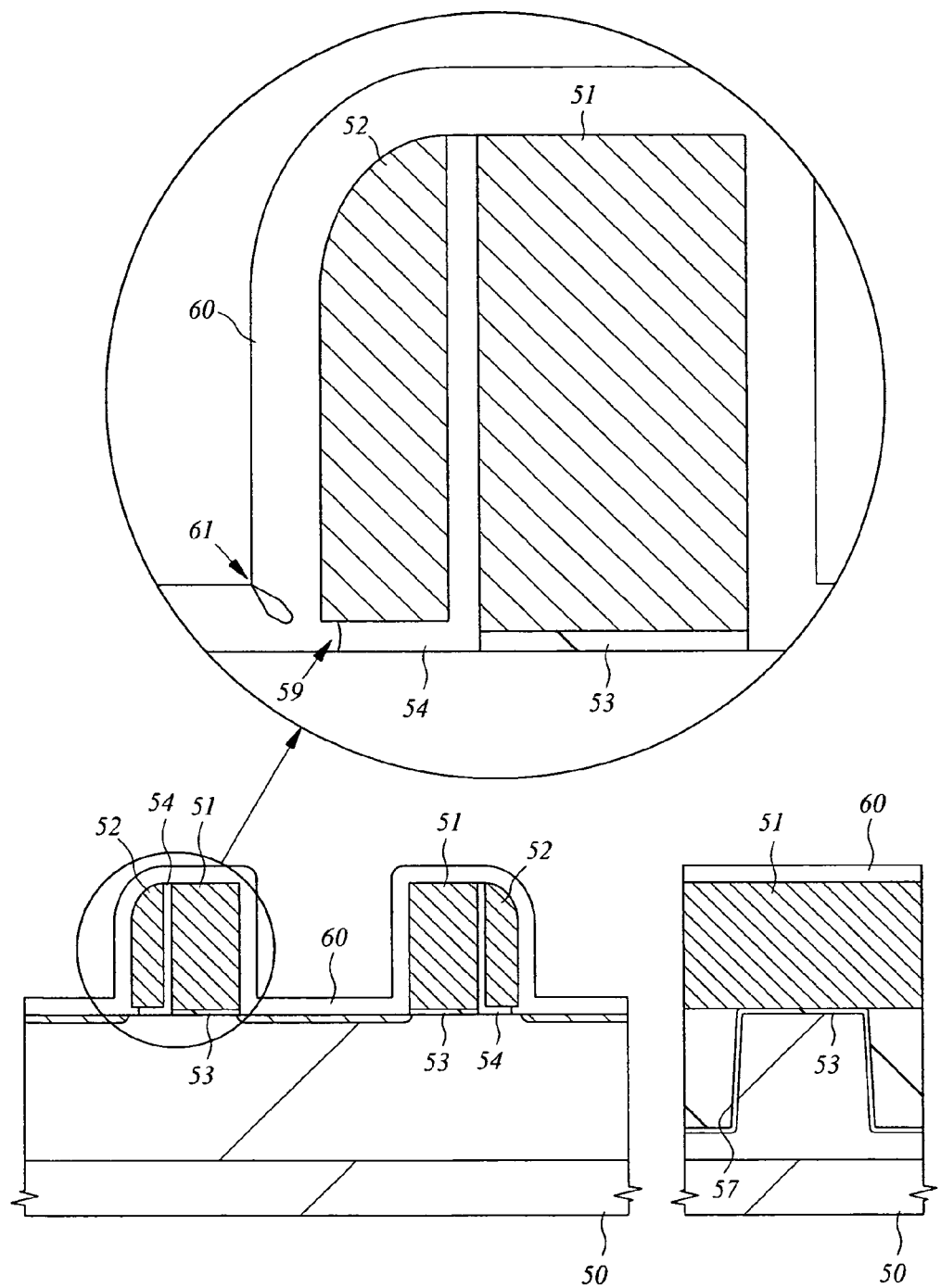
FIG. 45 is a cross-sectional view of principal parts showing the method of fabricating the MONOS nonvolatile memory subsequent to FIG. 44.

FIG. 34 is a example of fabrication of the memory applying the fabrication method according to the second embodiment. Namely, the sidewall-shaped silicon dioxide layers 34 are formed on the side surfaces of the memory gate 31, the ONO layer 30 in the regions other than the region below the memory gate 31 is removed by the wet etching, and the silicon dioxide layers 34 are then removed. According to the fabrication method, the ends of the ONO layer 30 are located outside of the respective side surfaces of the memory gate 31 by removing the silicon dioxide layers 34. Therefore, no low breakdown voltage region is generated when the silicon dioxide layer 35 is deposited. It is thereby possible to prevent the short-circuit between the memory gate 31 and the $n^+$-type semiconductor region 33 caused by the dielectric breakdown even if high voltage is applied between the memory gate 31 and the $n^+$-type semiconductor region 33.

The present invention has been specifically described with reference to the embodiments so far. However, it goes without saying that the present invention is not limited to the embodiments but that various changes and modifications can be made of the present invention without departure of the scope of the invention.

According to the invention disclosed in the specification of the present application, the ends of the ONO layer below the memory gate protrude outside of the memory gate. Due to this, no low breakdown voltage region is generated in a second insulating layer near each end of the memory gate. Therefore, it is possible to realize the semiconductor device capable of preventing the short-circuit between the memory gate and the semiconductor substrate caused by the dielectric breakdown even if a high potential difference is generated between the memory gate and the semiconductor substrate while the memory cell operates.

Moreover, even if isotropic etching is performed after the memory gate is formed, to form the mask outside the memory gate further, the semiconductor device can be fabricated without removing the ONO layer below the memory gate.

The present invention is effective to be used for a nonvolatile semiconductor memory device including a memory cell that includes a charge trapped layer constituted by a silicon nitride layer.

What is claimed is:

1. A semiconductor device comprising a split-gate memory cell, the memory cell including:

a selective gate formed on a principal surface of a semiconductor substrate through a gate insulating layer;

a memory gate formed on one side surface of the selective gate, the memory gate being in a form of a sidewall; and an ONO layer with a generally L-shaped cross section, includes one part formed between one side surface of the selective gate and one side surface of the memory gate, and an other part formed below the memory gate, wherein a second insulating layer is formed on an other side surface of the memory gate through a first insulating layer, the first insulating layer being in the form of a sidewall, the second insulating layer also being in the form of a sidewall, the second insulating layer in the form of the sidewall is formed on an other side surface of the selective gate, and one end of the ONO layer formed on the semiconductor substrate is terminated below the first insulating layer.

2. The semiconductor memory device according to claim 1, wherein hot electrons generated in the semiconductor substrate are injected into the ONO layer by applying a first voltage to the semiconductor substrate near the memory gate and a second voltage higher than the first voltage to the memory gate during a write operation.

3. The semiconductor memory device according to claim 2, wherein an erasing operation is performed by injecting holes into the ONO layer into which the hot electrons have been injected.

* * * * *